United States Patent
Sheen et al.

(10) Patent No.: US 11,681,852 B2
(45) Date of Patent: *Jun. 20, 2023

(54) OPTIMIZED LAYOUT CELL

(71) Applicant: Taiwan Semiconductor Manufacturing Co., Ltd., Hsinchu (TW)

(72) Inventors: Ruey-Bin Sheen, Taichung (TW); Tien-Chien Huang, Hsinchu (TW); Chuan-Yao Tan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/672,137

(22) Filed: Feb. 15, 2022

(65) Prior Publication Data

US 2022/0171914 A1    Jun. 2, 2022

Related U.S. Application Data

(63) Continuation of application No. 17/102,770, filed on Nov. 24, 2020, now Pat. No. 11,281,838.

(51) Int. Cl.
*G06F 30/398* (2020.01)
*G06F 30/392* (2020.01)
*G06F 30/3953* (2020.01)

(52) U.S. Cl.
CPC .......... *G06F 30/398* (2020.01); *G06F 30/392* (2020.01); *G06F 30/3953* (2020.01)

(58) Field of Classification Search
CPC .................................................... G06F 30/398
USPC ........................................................ 716/119
See application file for complete search history.

(56) References Cited

U.S. PATENT DOCUMENTS 8,978,003 B1    3/2015 Fu
2017/0345810 A1*  11/2017 Chiu ................. H01L 21/32055

\* cited by examiner

*Primary Examiner* — Eric D Lee
(74) *Attorney, Agent, or Firm* — Sterne, Kessler, Goldstein & Fox P.L.L.C.

(57) ABSTRACT

The present disclosure describes an example method for cell placement in an integrated circuit (IC) layout design. The method includes defining a layout unit for a circuit implementation and arranging multiple layout units into a layout cell. The method also includes editing the layout cell to connect a first set of the layout units to be representative of the circuit implementation and to connect a second set of the layout units to be representative of a non-functional circuit. Further, the method includes inserting one or more dummy fill structures in areas of the layout cell unoccupied by the first and second sets of layout units.

20 Claims, 20 Drawing Sheets

OPTIMIZED LAYOUT CELL

RELATED APPLICATION

This application is a continuation of U.S. patent application Ser. No. 17/102,770, titled "Optimized Layout Cell" and filed on Nov. 24, 2020, which is incorporated by reference herein in its entirety.

BACKGROUND

An electronic design automation (FDA) tool can be used for an integrated circuit (IC) design flow. For example, the EDA tool can be used to place layout cells (e.g., cells that implement logic or other electronic functions) in an IC layout design. As technology increases and the demand for scaled ICs grow, EDA tools become increasingly important to aid in the design of complex IC layout designs.

BRIEF DESCRIPTION OF THE DRAWINGS

Aspects of the present disclosure are best understood from the following detailed description when read with the accompanying figures. It is noted that, according to the standard. practice in the industry, various features are not drawn to scale. In fact, the dimensions of the various features may be arbitrarily increased or reduced for clarity of discussion.

DETAILED DESCRIPTION

Figure 1:
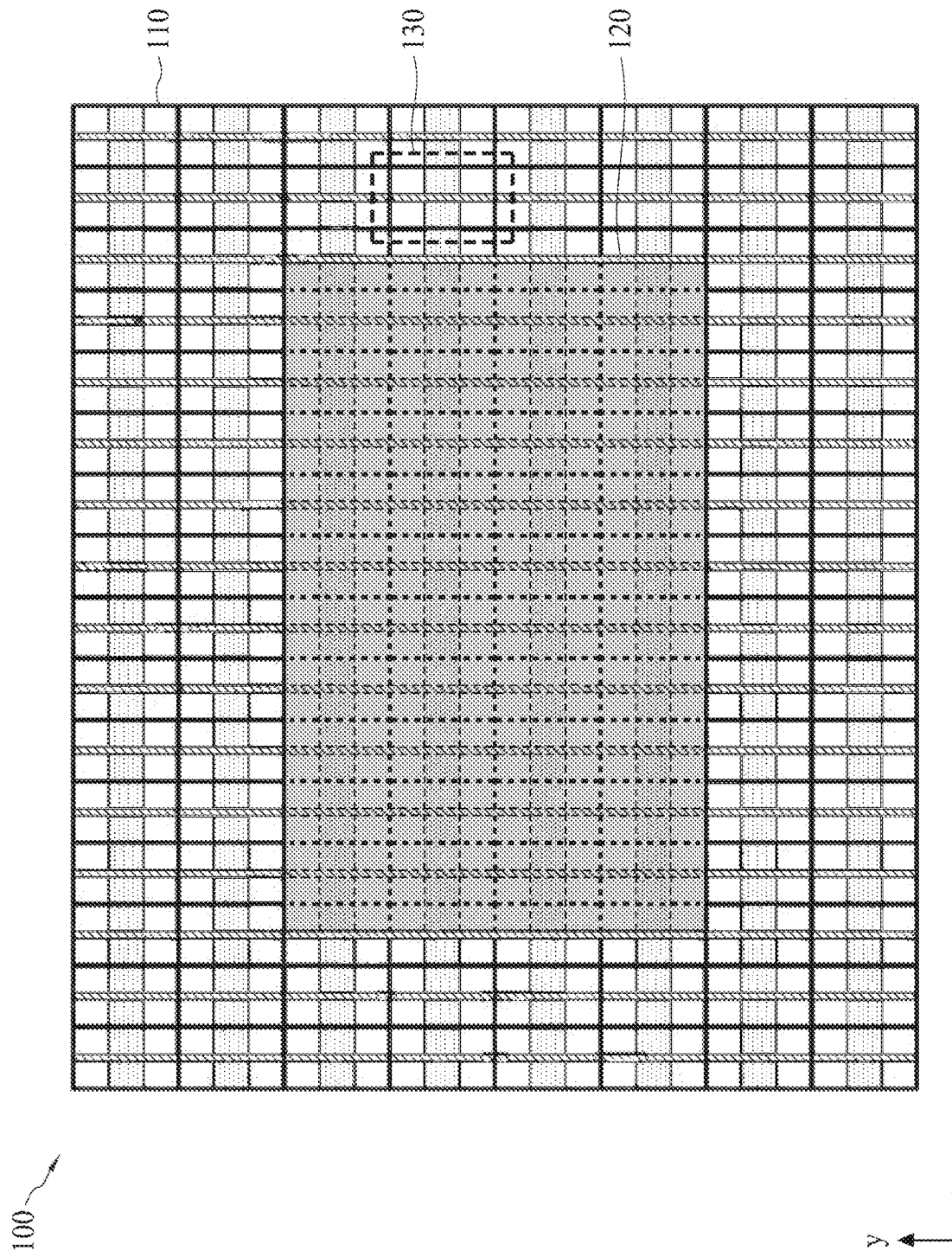
FIG. 1 is an illustration of a layout for a circuit implementation, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The following disclosure relates to optimizing layout cells in an integrated circuit (IC) layout design. Electronic design automation (FDA) tools can be used to place layout cells and dummy fill structures in the IC layout design. The layout cells can be associated with circuits that perform particular functions in the IC, such as a logic function, an analog function, and other suitable functions. The dummy fill structures have no particular function and can be inserted by the EDA tool to facilitate in layer planarity during the semiconductor manufacturing process, such as during a chemical mechanical polishing (CMP) process. As technology increases and the demand for scaled ICs grow, an increasing number of layout cells are required to fit in smaller IC layout designs, thus creating challenges for IC manufacturers. Embodiments of the present disclosure address this challenge, among others, by introducing layout cells (also referred to herein as "pre-placement layout cells") with different configurations to optimize a circuit implementation (and associated modifications to the circuit implementation) in the IC layout design while minimizing the insertion of dummy fill structures by the EDA tool.

FIG. 1 is an illustration of a layout 100 for a circuit implementation, according to some embodiments of the present disclosure. Layout 100 can include a layout cell 110 and a circuit implementation 120.

Layout cell 110 includes multiple layout units 130, according to some embodiments. In some embodiments, each of layout units 130 can be a layout representation of a single transistor device, such as an n-type field effect transistor (FET) device or a p-type FET device. The FET devices (e.g., n-type FET device and p-type FET device) can be planar metal-oxide-semiconductor FET devices, finFET devices, gate-all-around FET devices, any other suitable type of FET devices, or combinations thereof. In some embodiments, each of layout units 130 can be a layout representation of one or more transistor devices, such as a logic device (e.g., inverter logic device, NAND logic device, NOR logic device, and XOR logic device). Further details on and embodiments of layout cell 110 and layout unit 130 are described below.

Circuit implementation 120 can include one or more circuits that include an analog function, a logic function, or a combination thereof. For example, circuit implementation 120 can include a level-shifter circuit, an amplifier circuit, a passive device (e.g., resistor and capacitor), an inverter logic device, a NAND logic device, a NOR logic device, an XOR logic device, any other suitable analog/logic devices, or a combination thereof. In some embodiments, through the connection of multiple layout units 130 (e.g., through one or more interconnects), circuit implementation 120 can be achieved. Further details and embodiments on the connection of multiple layout units 130 to achieve a particular analog and/or logic circuit function are described below.

Figure 2:
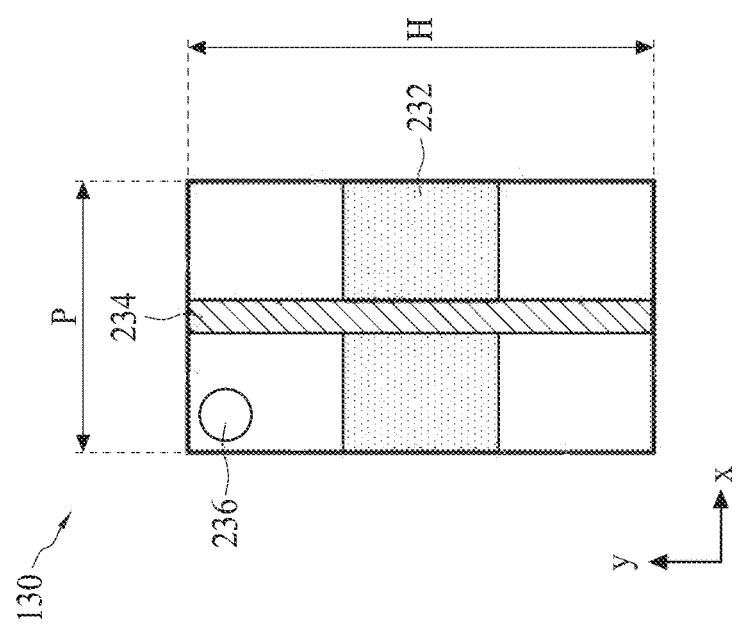
FIG. 2 is an illustration of a layout unit with a first configuration, according to some embodiments of the present disclosure.
Figure 3:
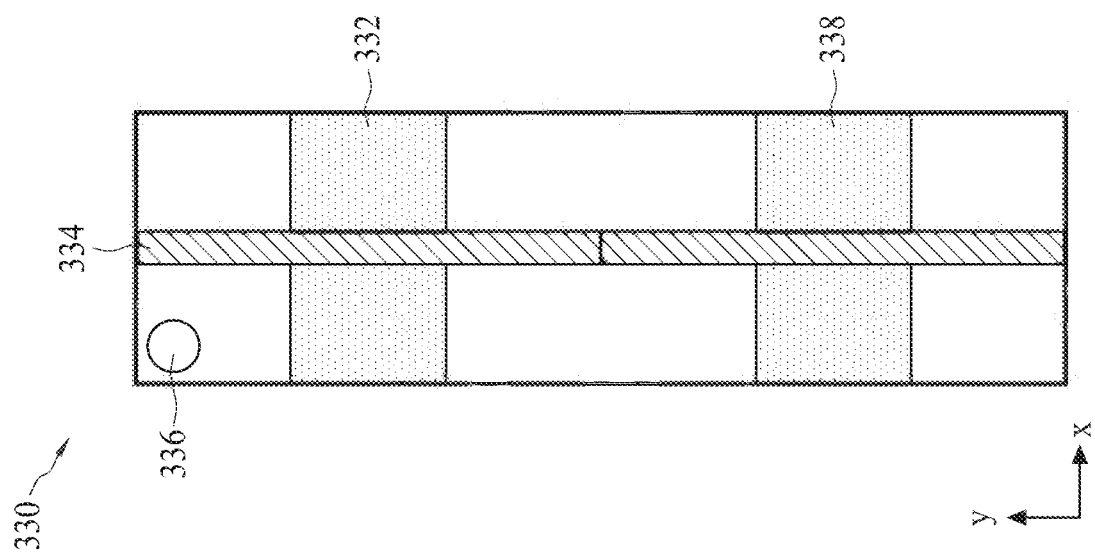
FIG. 3 is an illustration of a layout unit with a second configuration, according to some embodiments of the present disclosure.
Figure 4:
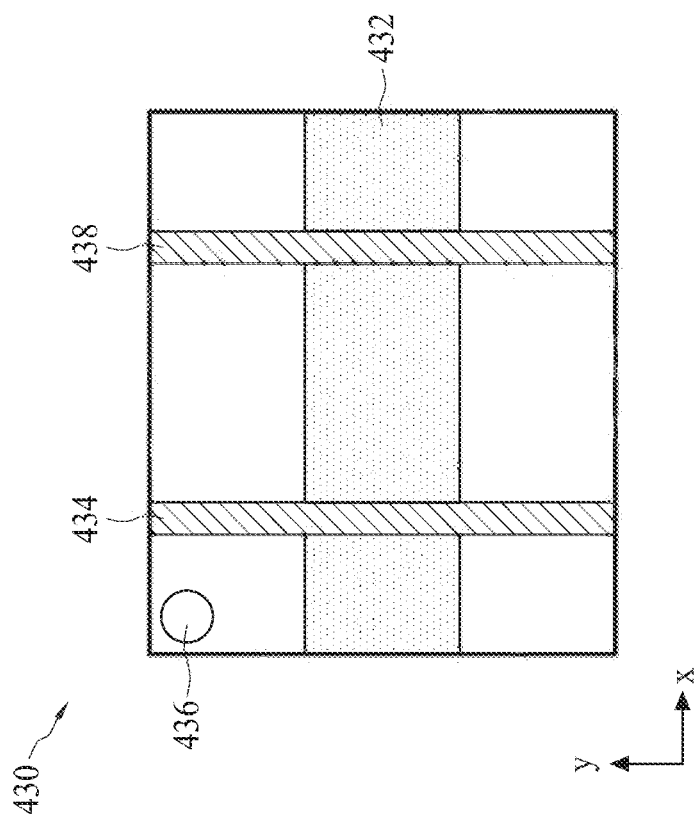
FIG. 4 is an illustration of a layout unit with a third configuration, according to some embodiments of the present disclosure.

FIGS. 2-4 describe embodiments of a layout unit that can be used in a layout cell, such as layout cell 110 of FIG. 1. FIG. 2 is an illustration of layout unit 130, according to some embodiments. In some embodiments, layout unit 130 can represent a single FET device, such as an n-type FET device and a p-type FET device. Layout unit 130 includes a diffusion layer 232 and a polysilicon layer 234. Diffusion layer 232 can be n-type or p-type such that, when polysilicon layer 234 traverses over diffusion layer 232, a FET device can be generated in layout. For illustration purposes, layout unit 130 also shows a rotation indicator 236 that is used to facilitate in the description of the embodiments herein.

In some embodiments, a height H of layout unit 130 (e.g., in the y-direction) is determined based on diffusion design rules associated with a technology node and/or a semiconductor manufacturing process for the overall layout (e.g., layout 100 of FIG. 1). For example, the height H can be determined based on design rules for a relative width and spacing of diffusion layer 232. A minimum Value for the height H can be based on a width of diffusion layer 232 (e.g., in the y-direction) and a spacing of another diffusion layer (not shown) away from diffusion layer 232 (e.g., in the y-direction).

In some embodiments, a pitch P of layout unit 130 (e.g., in the x-direction) is determined based a polysilicon design rule associated with a technology node and/or a semiconductor manufacturing process for the overall layout (e.g., layout 100 of FIG. 1). For example, the pitch P can be determined based on design rules for a relative width and spacing of polysilicon layer 234. A minimum value for the pitch P can be based on a width of polysilicon layer 234 (e.g., in the x-direction) and spacing of another polysilicon layer (not shown) away from polysilicon layer 234 (e.g., in the x-direction).

FIG. 3 is an illustration of another layout unit 330, according to some embodiments. In some embodiments, layout unit 330 can be used in layout cell 110 of FIG. 1 (instead of layout unit 130) and can represent two FET devices, such as two n-type FET devices and two p-type FET devices, that share a common gate terminal. Layout unit 330 includes a diffusion layer 332, a diffusion layer 338, and a polysilicon layer 334. Diffusion layers 332 and 338 can be n-type or p-type, such that, when polysilicon layer 334 traverses over diffusion layers 332 and 338, two FET devices that share a common gate terminal (e.g., through polysilicon layer 334) can be generated in layout. For illustration purposes, layout unit 330 also shows a rotation indicator 336 that is used to facilitate in the description of the embodiments herein. In some embodiments, the pitch of layout unit 330 can be the same as that of layout unit 130 in FIG. 2, and the height of layout unit 330 can be double of that of layout unit 130 in FIG. 2.

FIG. 4 is an illustration of another layout unit 430, according to some embodiments. In some embodiments, layout unit 430 can be used in layout cell 110 of FIG. 1 (instead of layout unit 130) and can represent two FET devices, such as two n-type FET devices and two p-type FET devices, that share a common source/drain (S/D) terminal. Layout unit 430 includes a diffusion layer 432, a polysilicon layer 434, and a polysilicon layer 438. Diffusion layer 432 can be n-type or p-type, such that, when polysilicon layers 434 and 438 traverse over diffusion layer 432, two FET devices that share a common S/D terminal (e.g., through diffusion layer 432 between polysilicon layer 434 and polysilicon layer 438) can be generated in layout. For illustration purposes, layout unit 430 also shows a rotation indicator 436 that is used to facilitate in the description of the embodiments herein. In some embodiments, the pitch of layout unit 430 can be double of that of layout unit 130 in FIG. 2, and the height of layout unit 430 can be the same as that of layout unit 130 in FIG. 2.

FIGS. 5-8 describe embodiments of layout cells that can be used in a layout, such as layout 100 of FIG. 1. For explanation purposes, multiple layout units 130 of FIG. 2 are depicted in the layout cells of FIGS. 5-8. Other layout units, such as layout unit 330 of FIG. 3 and layout unit 430 of FIG. 4, can also be used in the layout cells, according to some embodiments. Further, in some embodiments, the placement of the layout units in the layout cells shown in FIGS. 5-8 can be performed automatically by an EDA tool or manually by an entity (e.g., a layout design engineer) using the EDA tool.

Figure 5:
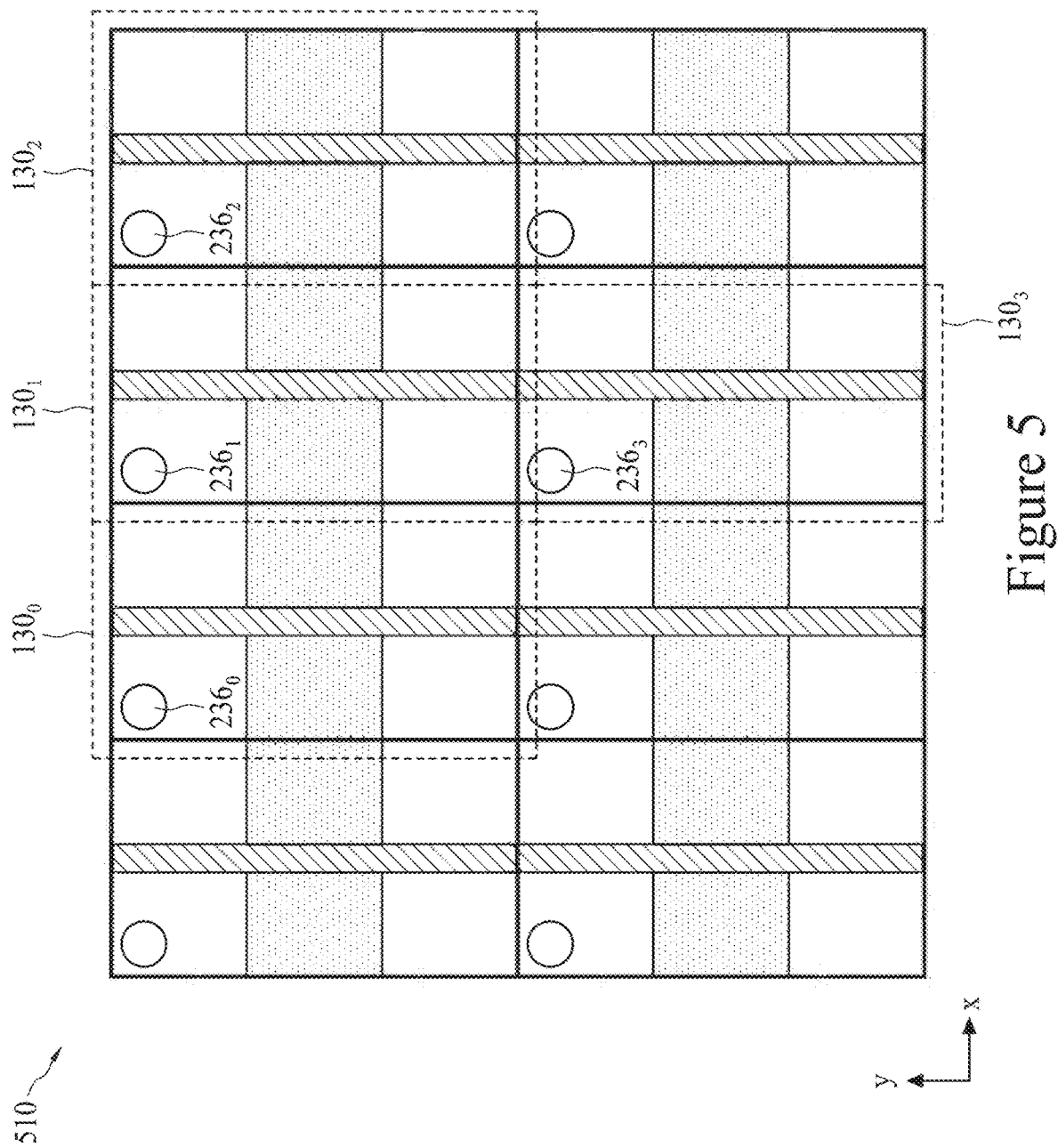
FIG. 5 is an illustration of a placement of multiple layout units with the first configuration in a first arrangement, according to some embodiments of the present disclosure.

FIG. 5 is an illustration of a layout cell 510, according to some embodiments. Layout cell 510 shows multiple layout units 130 that directly abut one another. In some embodiments, the direct abutment arrangement shown in FIG. 5 shows layout units 130 abutting one another in the same orientation along the horizontal and vertical directions (e.g., x- and y-directions, respectively)—in which rotation indicator 236 of each layout unit 130 is in the same relative position (e.g., upper left corner). For example, the left side of layout unit $130_1$ is abutted to the right side of layout unit $130_0$, the right side of layout unit $130_1$ is abutted to the left side of layout unit $130_2$, the bottom side of layout unit $130_1$ is abutted to the top side of layout unit $130_3$, and the top side of layout unit of $130_1$ is abutted to the bottom side of another layout unit 130 (not shown)—in which rotation indicators $236_0$-$236_3$ are in the upper left corner of layout units $130_0$-$130_3$, respectively.

Figure 6:
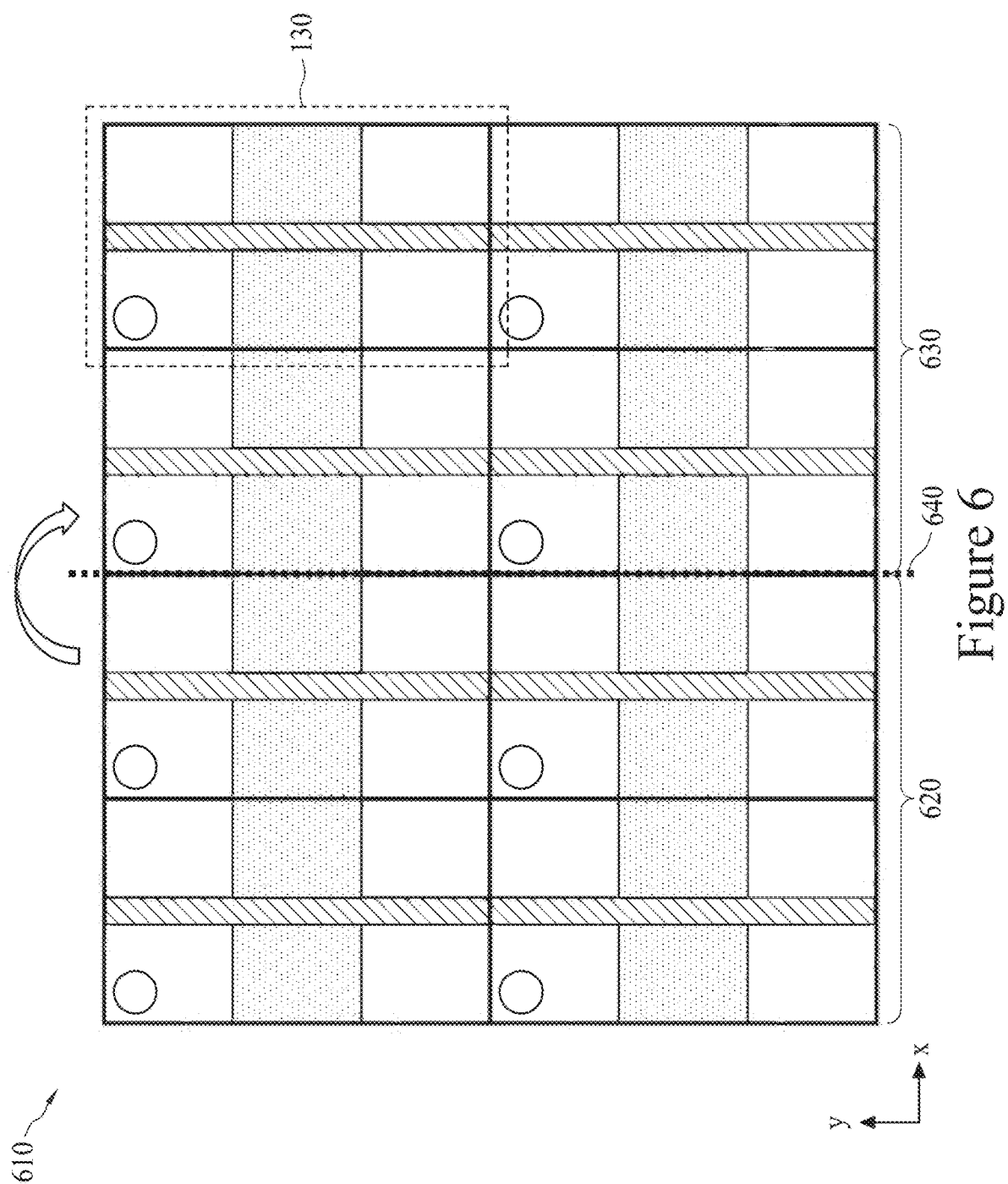
FIG. 6 is an illustration of a placement of multiple layout units with the first configuration in a second arrangement, according to sonic embodiments of the present disclosure.

FIG. 6 is an illustration of a layout cell 610, according to some embodiments. Layout cell 610 shows a first grouping 620 of layout units 130 and a second grouping 630 of layout units 130, in which first grouping 620 abuts second grouping 630 in a mirror arrangement. The mirror arrangement of first grouping 620 and second grouping 630 is indicated by a vertical axis 640 (e.g., in the y-direction), in which second grouping 630 mirrors (or has a symmetrical orientation to) first grouping 620 about vertical axis 640.

Figure 7:
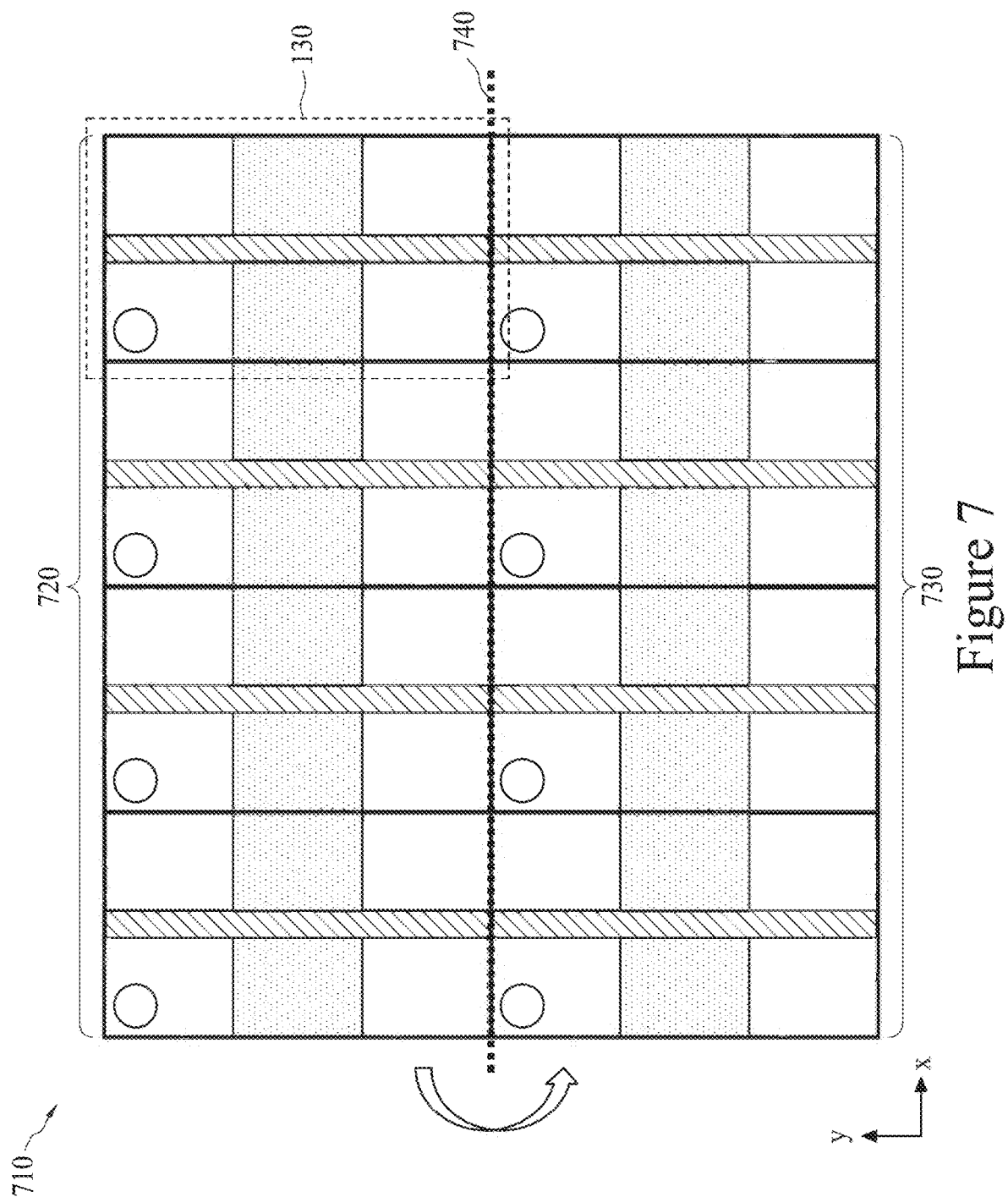
FIG. 7 is an illustration of a placement of multiple layout units with the first configuration in a third arrangement, according to some embodiments of the present disclosure.

FIG. 7 is an illustration of a layout cell 710, according to some embodiments. Layout cell 710 shows a first grouping 720 of layout units 130 and a second grouping 730 of layout units 130, in which first grouping 720 abuts second grouping 730 in a flipped arrangement. The flipped arrangement of first grouping 720 and second grouping 730 is indicated by a horizontal axis 740 (e.g., in the x-direction), in which second grouping 730 is a flipped version of for has a symmetrical orientation to) first grouping 720 about horizontal axis 740.

Figure 8:
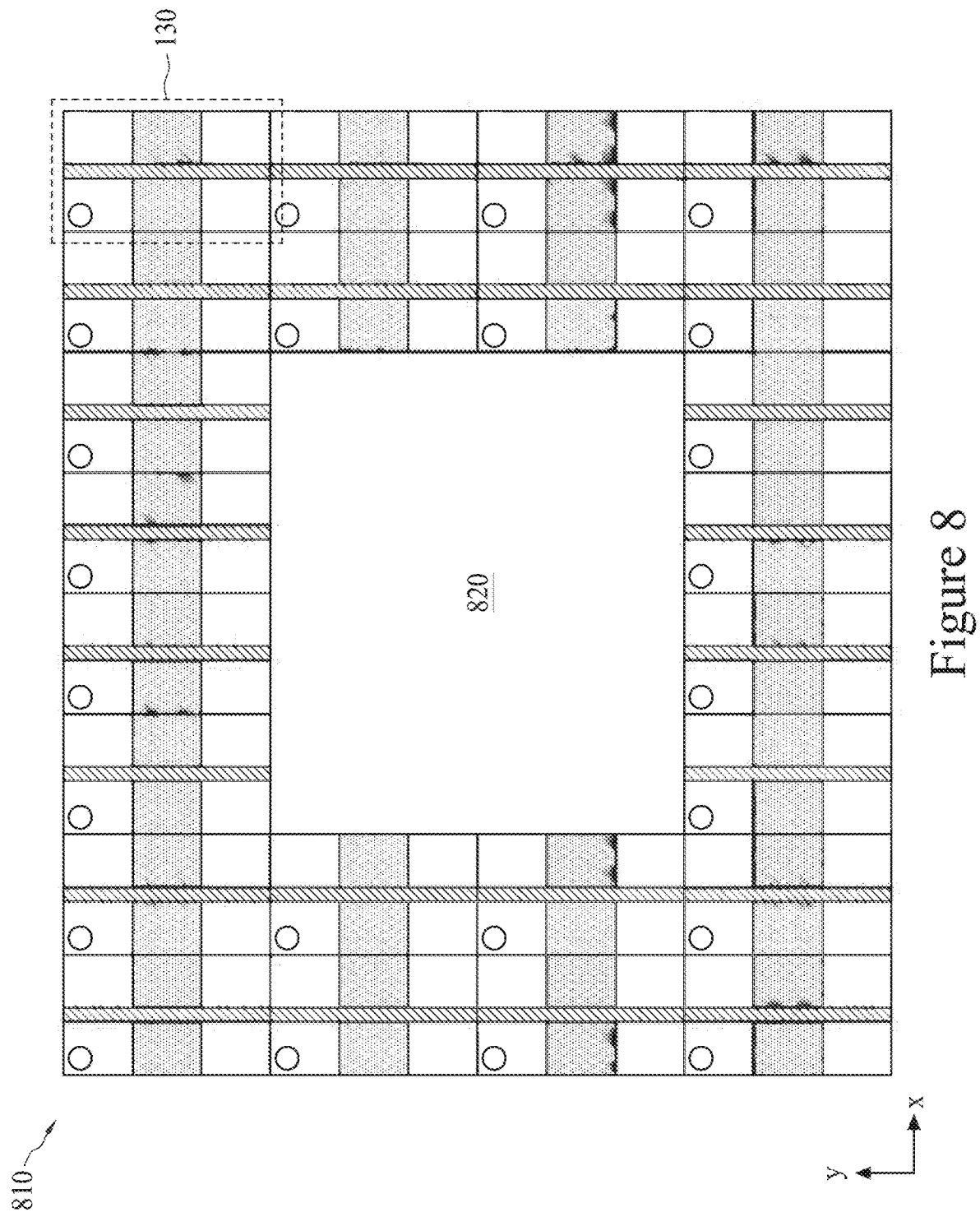
FIG. 8 is an illustration of a placement of multiple layout units with the first configuration in a fourth arrangement, according to some embodiments of the present disclosure.

FIG. 8 is an illustration of a layout cell 810, according to some embodiments. Layout cell 810 shows multiple layout units 130 that directly abut one another—e.g., similar to the direct abutment arrangement of layout units 130 in FIG. 5—and a region 820 devoid of layout units 130 (also referred to as a "hollow area 820"). Though hollow area 820 is shown in a central region of layout cell 810, hollow area 820 can be located in other regions (e.g., upper left corner, upper right corner, lower left corner, and lower right corner regions) of layout cell 810, according to some embodiments. In some embodiments, hollow area 820 can vary in size and shape and can be the size of one or more layout units 130. Further, in some embodiments, layout cell 810 can include multiple hollow areas 820.

In some embodiments, a circuit implementation that cannot be performed by one or more interconnected layout units 130 can be placed in hollow area 820. For example, the circuit implementation can include a passive device (e.g., resistor and capacitor), a varactor, a diode, a bipolar junction transistor device, or a combination thereof. In some embodiments, a circuit implementation that operates in a different power domain than that of layout units 130—e.g., a level-shifter device can be placed in hollow area 820. In some embodiments, hollow area 820 can be empty—e.g., with no circuit implementation to provide isolation between multiple circuit implementations in layout cell 810.

FIGS. 9-13 describe embodiments of another layout unit and other layout cells that can be used in a layout, such as layout 100 of FIG. 1. In some embodiments, the placement of the layout units in the layout cells shown in FIGS. 10-13 can be performed automatically by an EDA tool or manually by an entity (e.g., a layout design engineer) using the EDA tool.

Figure 9:
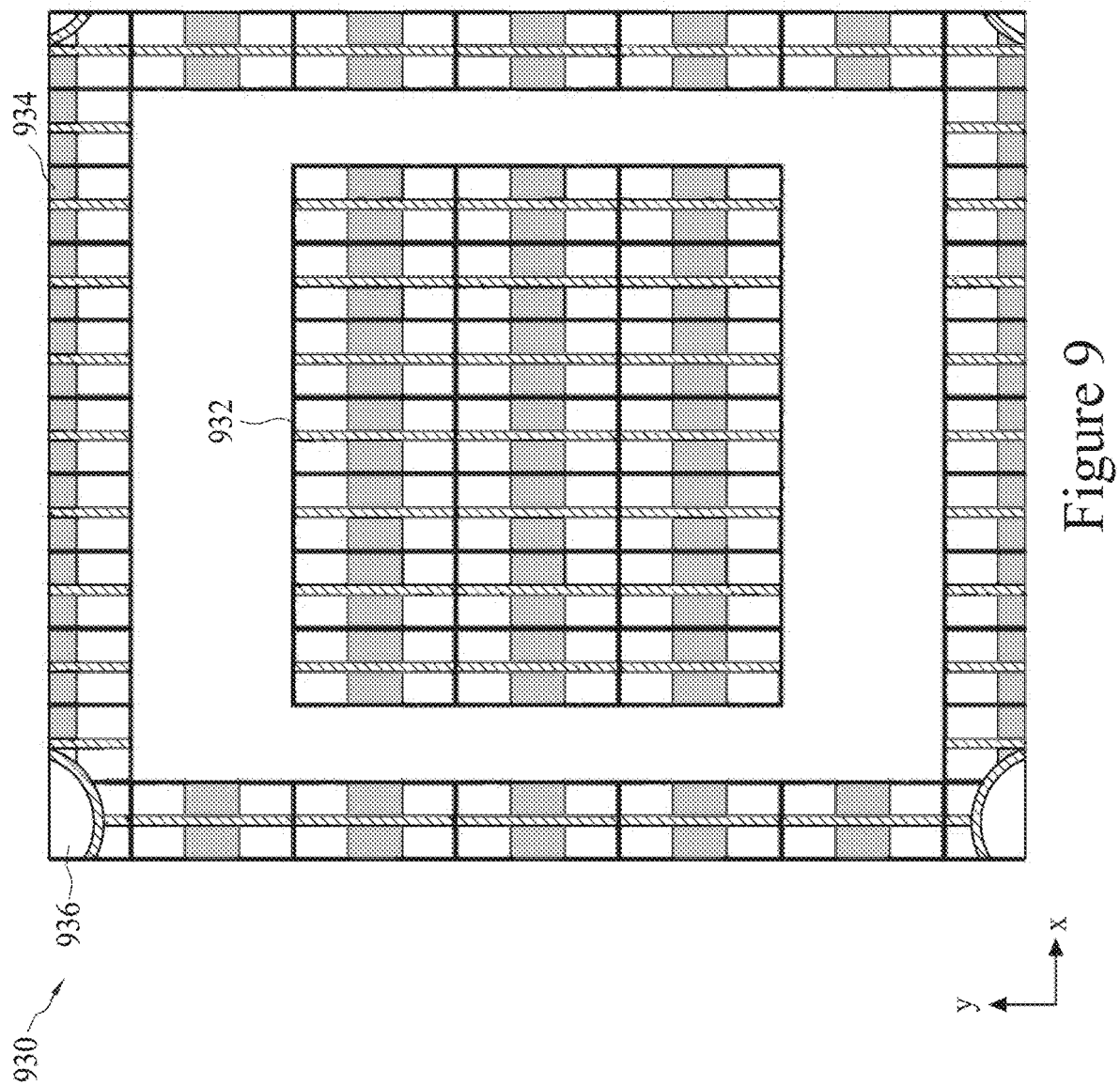
FIG. 9 is an illustration a layout unit with a fourth configuration, according to some embodiments of the present disclosure.
Figure 10:
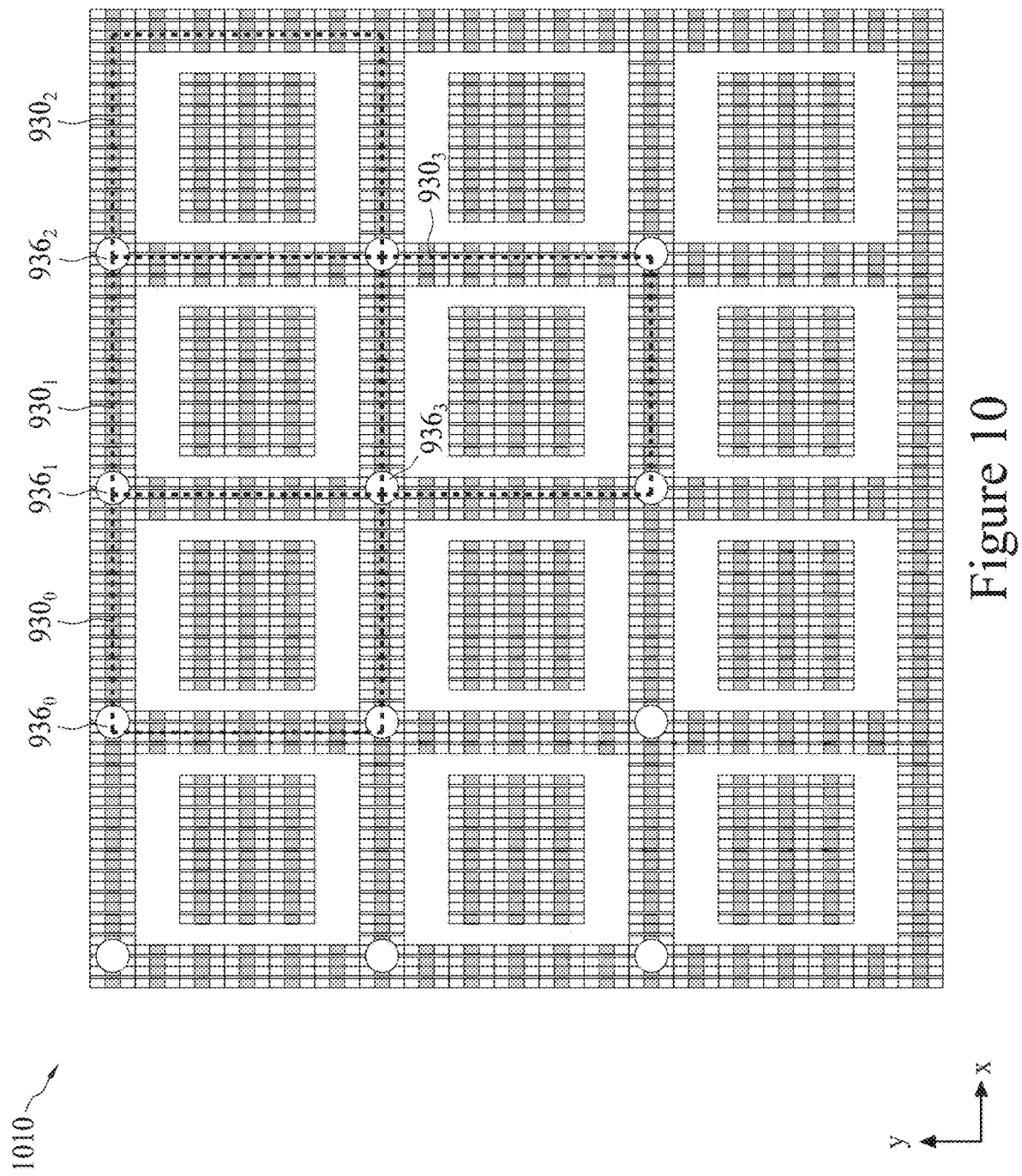
FIG. 10 is an illustration of a placement of multiple layout units with the fourth configuration in a first arrangement, according to some embodiments of the present disclosure.

FIG. 9 is an illustration of a layout unit 930, according to some embodiments. Layout unit 930 includes a circuit 932 and a guard ring 934. In some embodiments, circuit 932 includes multiple transistor devices e.g., multiple n-type and/or p-type FET devices—interconnected in a particular configuration to provide a specific function. For example, circuit 932 can include multiple interconnected transistor devices to provide a current mirror function, an amplifier function, any other suitable function, or a combination thereof. Guard ring 934 can surround circuit 932 to provide isolation from surrounding layout elements, such as other layout units 930. For illustration purposes, layout unit 930 also shows a rotation indicator 936 that is used to facilitate in the description of the embodiments herein, FIG. 10 is an illustration of a layout cell 1010, according to some embodiments. Layout cell 1010 shows multiple layout units 930 that directly abut one another. In some embodiments, the direct abutment arrangement shown in FIG. 10 shows layout units 930 abutting one another in the same orientation along the horizontal and vertical directions (e.g., x- and y-directions, respectively)—in which rotation indicator 936 of each layout unit 930 is in the same relative position (e.g., upper left corner). For example, the left side of layout unit $930_1$ is abutted to the right side of layout unit $930_0$, the right side of layout unit $930_1$ is abutted to the left side of layout unit $930_2$, the bottom side of layout unit $930_1$ is abutted to the top side of layout unit $930_3$, and the top side of layout unit of $930_1$ is abutted to the bottom side of another layout unit 930 (not shown)—in which rotation indicators $936_0$-$936_3$ are in the upper left corner of layout units $930_0$-$930_3$, respectively.

Figure 11:
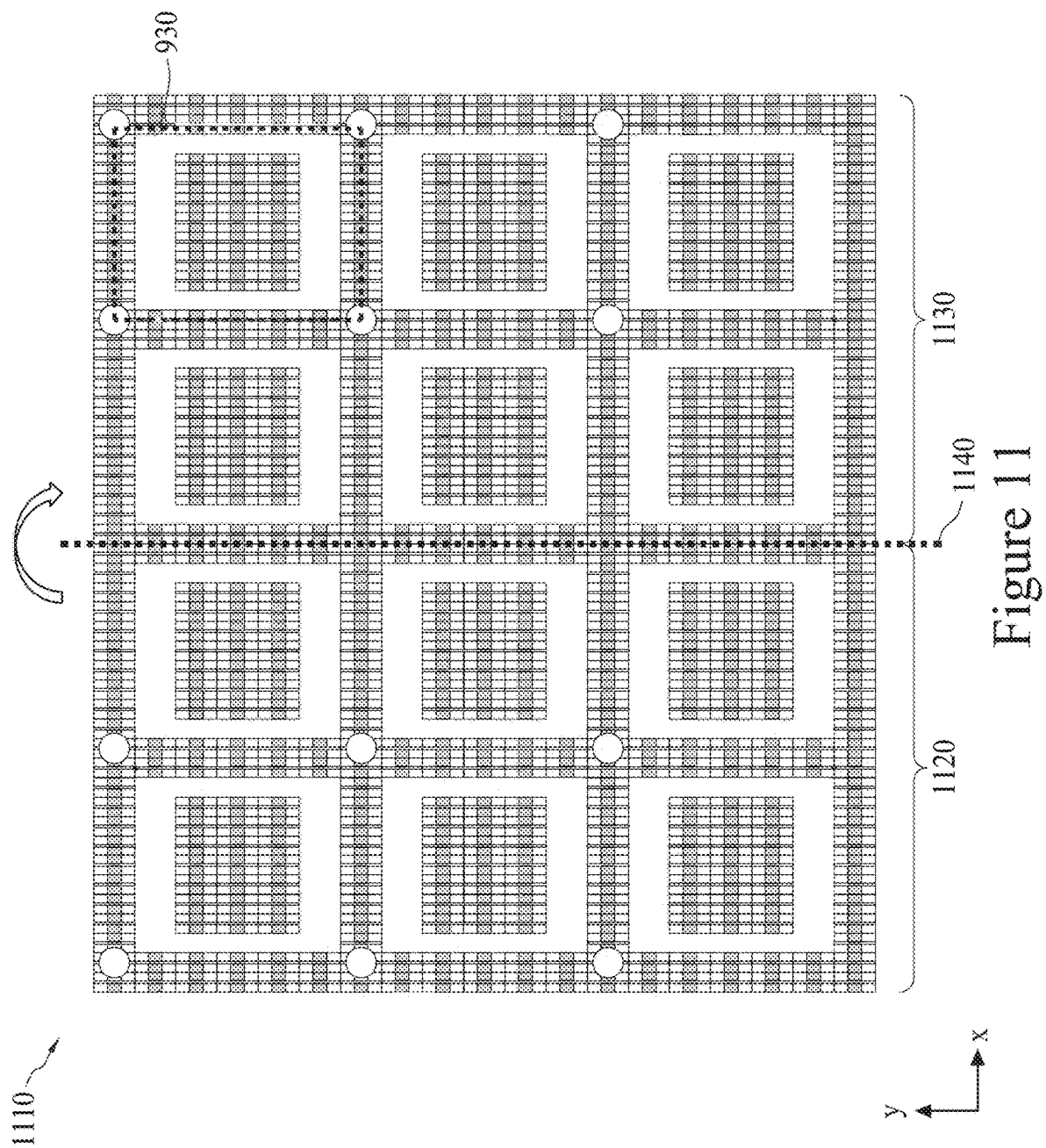
FIG. 11 is an illustration of a placement of multiple layout units with the fourth configuration in a second arrangement, according to some embodiments of the present disclosure.

FIG. 11 is an illustration of a layout cell 1110, according to some embodiments. Layout cell 1110 shows a first grouping 1120 of layout units 930 and a second grouping 1130 of layout units 930, in which first grouping 1120 abuts second grouping 1130 in a mirror arrangement. The mirror arrangement of first grouping 1120 and second grouping 1130 is indicated by a vertical axis 1140 (e.g., in the y-direction), in which second grouping 1130 mirrors (or has a symmetrical orientation to) first grouping 1120 about vertical axis 1140.

Figure 12:
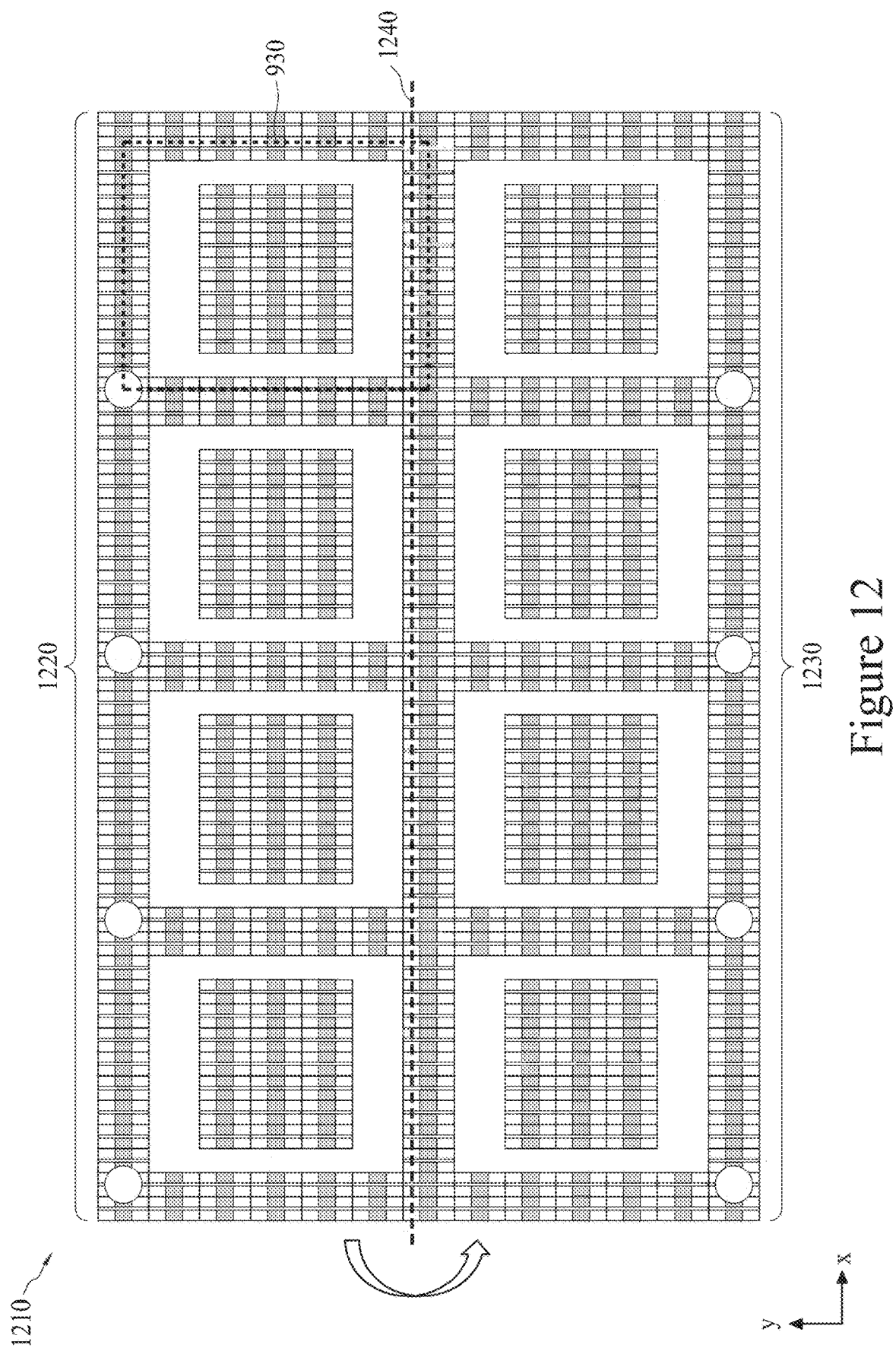
FIG. 12 is an illustration of a placement of multiple layout units with the fourth configuration in a third arrangement, according to some embodiments of the present disclosure.

FIG. 12 is an illustration of a layout cell 1210, according to some embodiments. Layout cell 1210 shows a first grouping 1220 of layout units 930 and a second grouping 1230 of layout units 930, in which first grouping 1220 abuts second grouping 1230 in a flipped arrangement. The flipped arrangement of first grouping 1220 and second grouping 1230 is indicated by a horizontal axis 1240 (e.g., in the x-direction), in which second grouping 1230 is a flipped version of (or has a symmetrical orientation to) first grouping 1220 about horizontal axis 1240.

Figure 13:
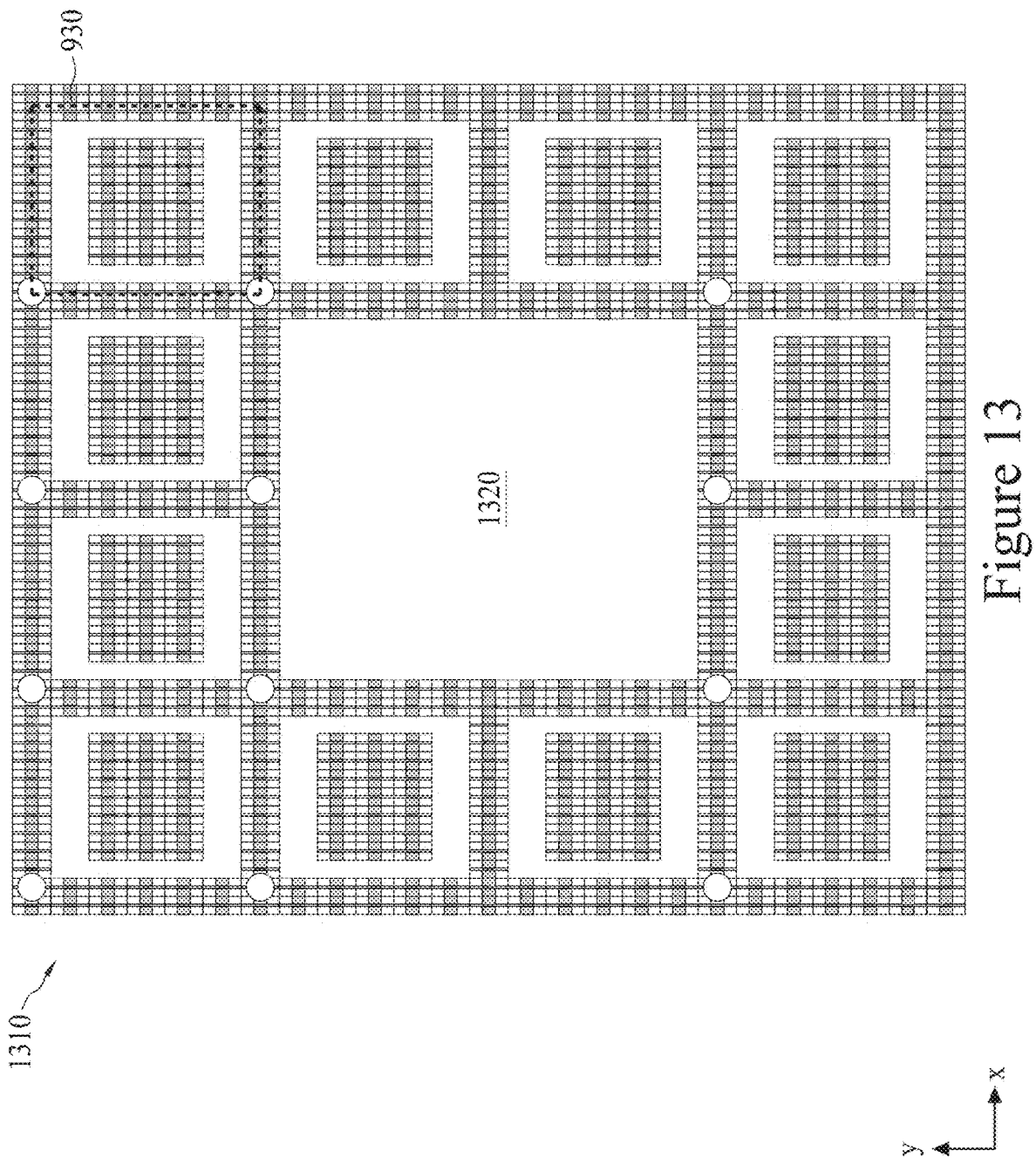
FIG. 13 is an illustration of a placement of multiple layout units with the fourth configuration in a fourth arrangement, according to some embodiments of the present disclosure.

FIG. 13 is an illustration of a layout cell 1310, according to some embodiments, Layout cell 1310 shows multiple layout units 930 that directly abut one another—e.g., similar to the direct abutment arrangement of layout units 930 in FIG. 10—and a region 1320 devoid of layout units 930 (also referred to as a "hollow area 1320"). Though hollow area 1320 is shown in a central region of layout cell 1310, hollow area 1320 can be located in other regions (e.g., upper left corner, upper right corner, lower left corner, and lower right corner regions) of layout cell 1310, according to some embodiments, In some embodiments, hollow area 1320 can vary in size and shape and can be the size of one or more layout units 930. Further, in some embodiments, layout cell 1310 can include multiple hollow areas 1320.

In some embodiments, hollow area 1320 of FIG. 13 can include a circuit implementation that cannot be performed by one or more interconnected layout units 930, such as a passive device (e.g., resistor and capacitor), a varactor, a diode, a bipolar junction transistor device, or a combination thereof. In some embodiments, a circuit implementation that operates in a different power domain than that of layout units 930—e.g., a level-shifter device—can be placed in hollow area 1320. In some embodiments, hollow area 1320 can be empty—e.g., with no circuit implementation—to provide isolation between multiple circuit implementations in layout cell 810.

Figure 14:
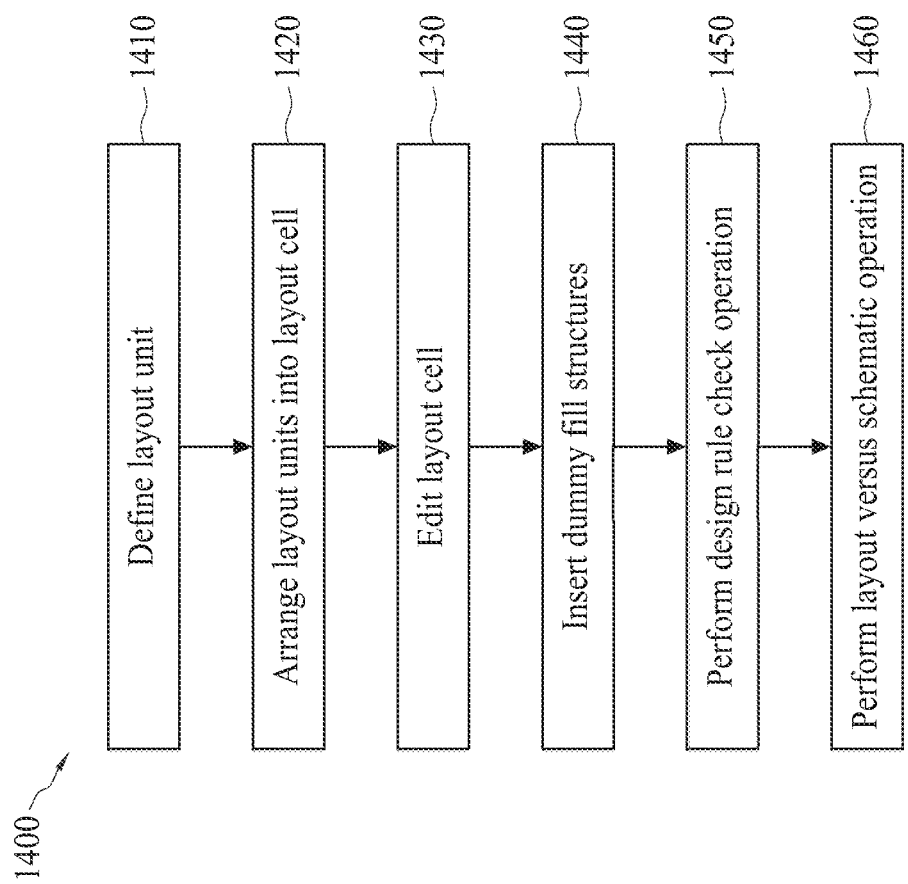
FIG. 14 is an illustration of method for connecting layout units in a pre-placement layout cell, according to sonic embodiments of the present disclosure.

FIG. 14 is an illustration of a method 1400 for connecting layout units in a pre-placement layout cell, according to some embodiments. The operations of method 1400 can be performed with embodiments of the layout units and layout cells described herein—such as layout unit 130 of FIG. 2, layout unit 330 of FIG. 3, layout unit 430 of FIG. 4, layout cell 510 of FIG. 5, layout cell 610 of FIG. 6, layout cell 710 of FIG. 7, layout cell 810 of FIG. 8, layout unit 930 of FIG. 9, layout cell 1030 of FIG. 10, layout cell 1110 of FIG. 11, layout cell 1210 of FIG. 12, and layout cell 1310 of FIG. 13—and can be performed in a different order or not performed depending on specific applications. Further, the operations of method 1400 can be performed by one or more processors executing instructions, such as instructions or operations associated with an EDA tool. An example of the one or more processors is described in computer system 1900 of FIG. 19 below.

Figure 15:
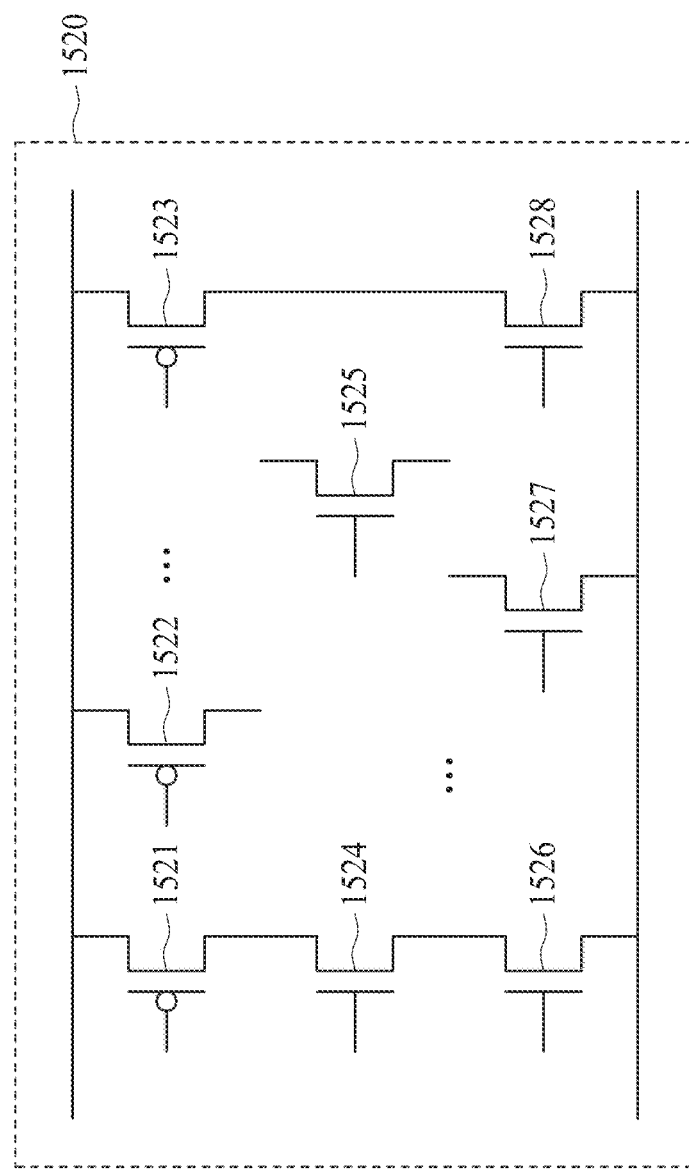
FIG. 15 is an illustration of an example circuit implementation for a pre-placement layout cell, according to some embodiments of the present disclosure.

In operation 1410, a layout unit is defined for a circuit implementation. FIG. 15 is an illustration of an example circuit implementation 1520 that can be used to determine a layout unit in operation 1410, according to some embodiments. Example circuit implementation 1520 includes p-type FET devices 1521-1523 and n-type FET devices 1524-1528. Example circuit implementation 1520 is shown for explanation purposes and are not all connected at their gate and S/D terminals.

In some embodiments, layout unit 130 of FIG. 2 can be selected to construct a layout for example circuit implementation 1520, where layout units 130 for n-type FET devices and p-type FET devices would be required for example circuit implementation 1520. In some embodiments, layout unit 330 of FIG. 3 or layout unit 430 of FIG. 4 can be selected, where layout units 330 or layout units 430 for n-type BET devices and p-type BET devices would be required for example circuit implementation 1520. Further, in some embodiments, layout unit 930 of FIG. 9 can be selected, where circuit 932 can represent the multiple FBI devices 1521-1528 in example circuit implementation 1520.

Figure 16:
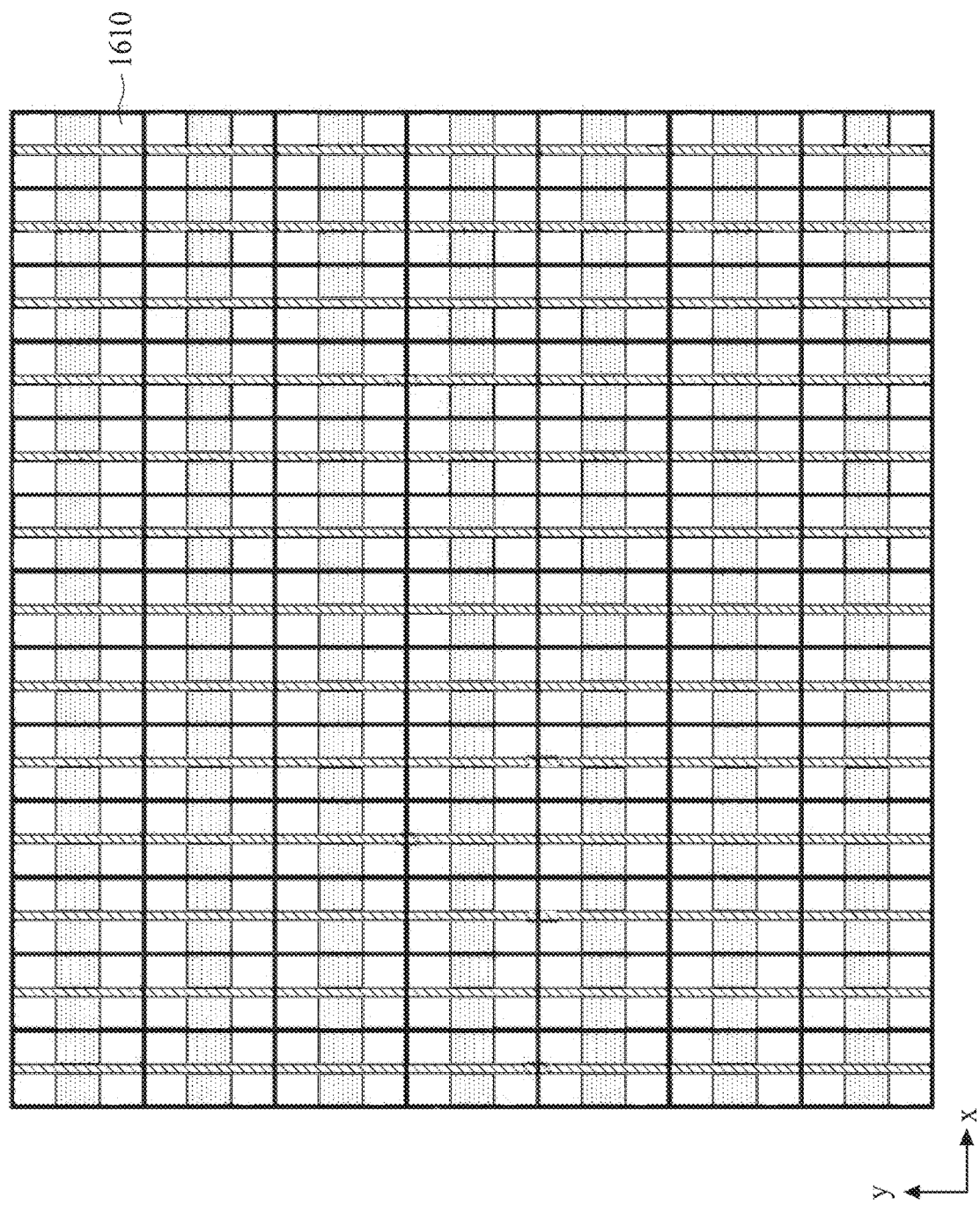
FIG. 16 is an illustration of a pre-placement layout cell, according to some embodiments of the present disclosure.

In operation 1420, multiple layout units are arranged into a layout cell. FIG. 16 is an illustration of a layout cell (or pre-placement layout cell) 1610 with multiple layout units abutting one another, according to some embodiments. Layout cell 1600 is not limited to the arrangement shown in FIG. 16 and can have any suitable arrangement of layout cells, such as the arrangements shown in layout cell 510 of FIG. 5, layout cell 610 of FIG. 6, layout cell 710 of FIG. 7, layout cell 810 of FIG. 8, layout cell 1010 of FIG. 10, layout cell 1110 of FIG. 11, layout cell 1210 of FIG. 12, and layout cell 1310 of FIG. 13. In some embodiments, the placement of the layout units in the layout cell can be performed automatically by an EDA tool or manually by an entity (e.g., a layout design engineer) using the EDA tool.

Figure 17:
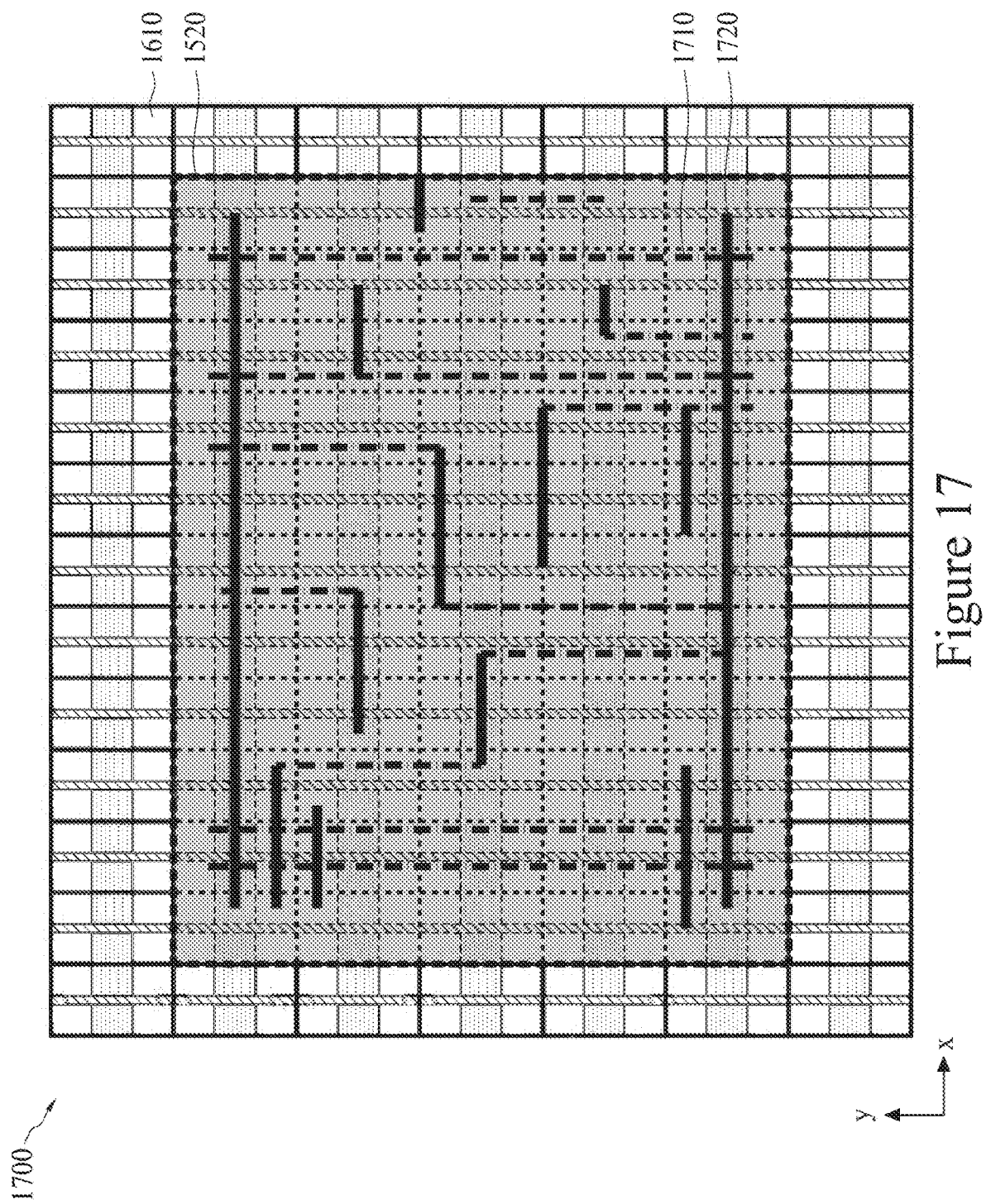
FIG. 17 is an illustration of a pre-placement layout cell with multiple layout units electrically connected to represent an example circuit implementation, according to some embodiments of the present disclosure.

In operation 1430, the layout cell is edited to be representative of the circuit implementation. FIG. 17 is an illustration of a layout 1700 with multiple layout units in layout cell 1610 electrically connected to represent example circuit implementation 1520, according to some embodiments. In some embodiments, a first set of layout units from the multiple layout units in layout cell 1610 are connected to one another using vertical interconnects 1710 (e.g., the y-direction) and horizontal interconnects 1720 to be representative of example circuit implementation 1520. As shown in FIG. 17, the first set of layout units in layout cell 1610 overlap with the outline of example circuit implementation 1520. In some embodiments, some but not all of the layout units that overlap with the outline of example circuit implementation 1520 are used to implement example circuit implementation 1520.

In some embodiments, a second set of layout units from the multiple layout units in layout cell 1610 can be defined by the layout units that are not used to implement example circuit implementation 1520, such as the layout units along the periphery of layout cell 1610 (e.g., the layout units outside of the outline of example circuit implementation 1520). The second set of layout units can be connected to a power supply (e.g., 0.4 V, 0.6 V, 0.7 V, 1.0 V, 1.2 V, 1.8 V, 2.4 V, 3.3 V, 5 V, and any other suitable power supply voltage) and/or ground (e.g. 0 V) to be representative of a non-functional circuit. For example, the gate and S/D terminals of the n-type FET devices can be connected to ground, and the gate and S/D terminals of the p-type. FET devices can be connected to the power supply—thus, these PET devices are inactive and can be considered as a non-functional circuit.

In some embodiments, though not shown, layout 1700 of FIG. 17 can include one or more regions devoid of layout units (also referred to as a "hollow area"). As described above, the hollow area can be used to place another circuit implementation that cannot be performed by the interconnected layout units in layout cell 1610, such as a passive device (e.g., resistor and capacitor), a varactor, a diode, a bipolar junction transistor device, or a combination thereof. The hollow area can also be used to implement another circuit implementation that operates in a different power domain than that of the layout units in layout cell 1610, such as a level-shifter device. Further, the hollow area can be empty—e.g., with no circuit implementation to provide isolation between multiple circuit implementations in layout cell 1610.

In operation 1440, one or more dummy fill structures are inserted in areas of the layout cell unoccupied by the first and second sets of layout units. The dummy fill structures have no particular function and can be inserted by the EDA tool to facilitate in layer planarity during the semiconductor manufacturing process, such as during a CMP process. In some embodiments, the regions in which the tool can insert dummy fill structures are limited to layout cell regions without layout units. For example, in a layout cell with a hollow area (e.g., layout cell 810 in FIG. 8 and layout cell 1310 in FIG. 13), the EDA tool can insert dummy fill structures in regions of the hollow area that are not occupied by a circuit implementation.

In operation 1450, a design rule check (DRC) operation is performed to confirm that the edited layout cell (of operation 1430) conforms to design rules associated with a technology node and/or a semiconductor manufacturing process. The design rules can specific certain geometric and connectivity restrictions to ensure sufficient margins to account for variability in the semiconductor manufacturing process. These restrictions set the minimum widths of the different shapes and layers used in the layout and the minimum spacing between adjacent layout elements.

In operation 1460, a layout versus schematic (LVS) operation is performed to confirm that the edited layout cell (of operation 1430) conforms to a schematic of the circuit implementation. In some embodiments, a layout netlist can be generated based on the edited layout cell. For example, based on the interconnections of the layout units in layout cell 1610, the layout netlist can be generated. This layout netlist can be compared to the schematic of the circuit implementation (e.g., example circuit implementation 1520 in FIG. 15) to confirm that the electrical connections among the layout units in layout cell 1610 are correct.

A benefit, among others, of method 1400 and the embodiments described herein is the optimization of layout cells in the IC layout design. This optimization is advantageous for at least two reasons. First, by manufacturing the layout cells based on uniform layout units, the yield of the circuit implementation increases because pattern variations are similar and/or limited in number throughout the layout cells. With this predictability in similar and/or limited pattern variations, the uniform layout units can be optimized for various parameters and dimensions, such as gate/source/drain contact pitch, metal routing pitch, and metal cut/isolation pitch.

Figure 18:
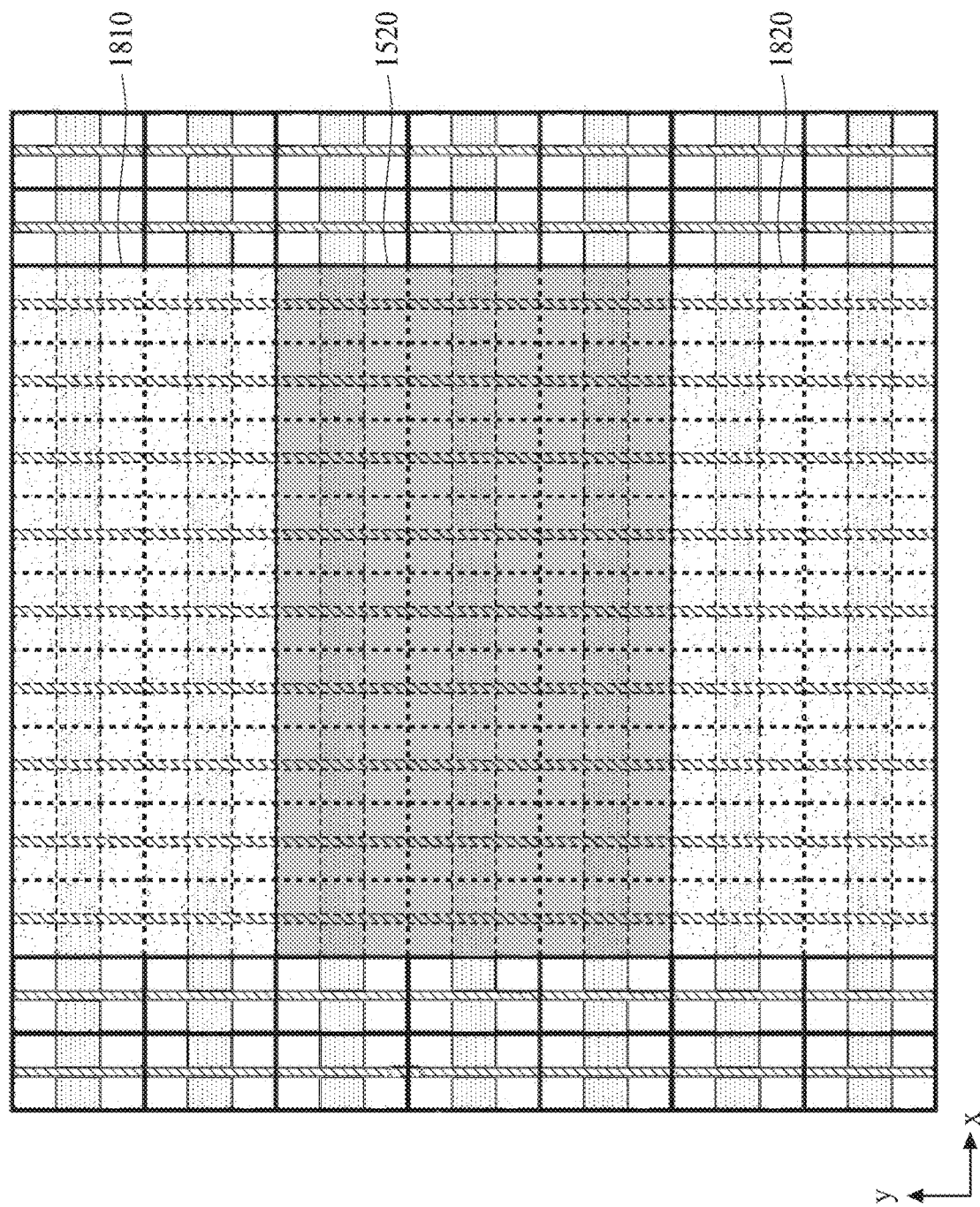
FIG. 18 is an illustration of a layout for a circuit implementation and associated modifications, according to some embodiments of the present disclosure.

Second, manufacturing layout cells based on uniform layout units is advantageous for re-tapeout IC designs, where modifications to an original circuit implementation that has been manufactured (or taped out) may be needed to improve functionality and/or performance. FIG. 18 is an illustration of a layout 1800 for a circuit implementation and associated re-tapeout modifications. Layout 1800 includes example circuit implementation 1520 and modification regions 1810 and 1820.

In some embodiments, after example circuit implementation 1520 has been manufactured based on layout 1700 of FIG. 17, post-manufacturing tests may reveal defects in the circuit design, such as a non-operational circuit and lower-than-anticipated device performance. Unused layout units in layout cell 1610 (e.g., the second set of layout units in operation 1430 of FIG. 14) can be used to address these defects. For example, referring to FIG. 18, unused layout units in modification regions 1810 and 1820 can be activated and electrically connected to example circuit implementation 1520 to address the defects. The activation of these unused layout units has advantages, according to some embodiments. For example, because the unused layout units were defined based on example circuit implementation 1520 in operation 1410 of FIG. 14), the unused layout units are likely to include the transistor devices or group of transistor devices needed to address the defects as compared to layout units that weren't defined based on example circuit implementation 1520. Further, because the unused layout units were defined based on example circuit implementation 1520, a lower number of mask changes are likely needed as compared to layout units that weren't defined based on example circuit implementation 1520.

Figure 19:
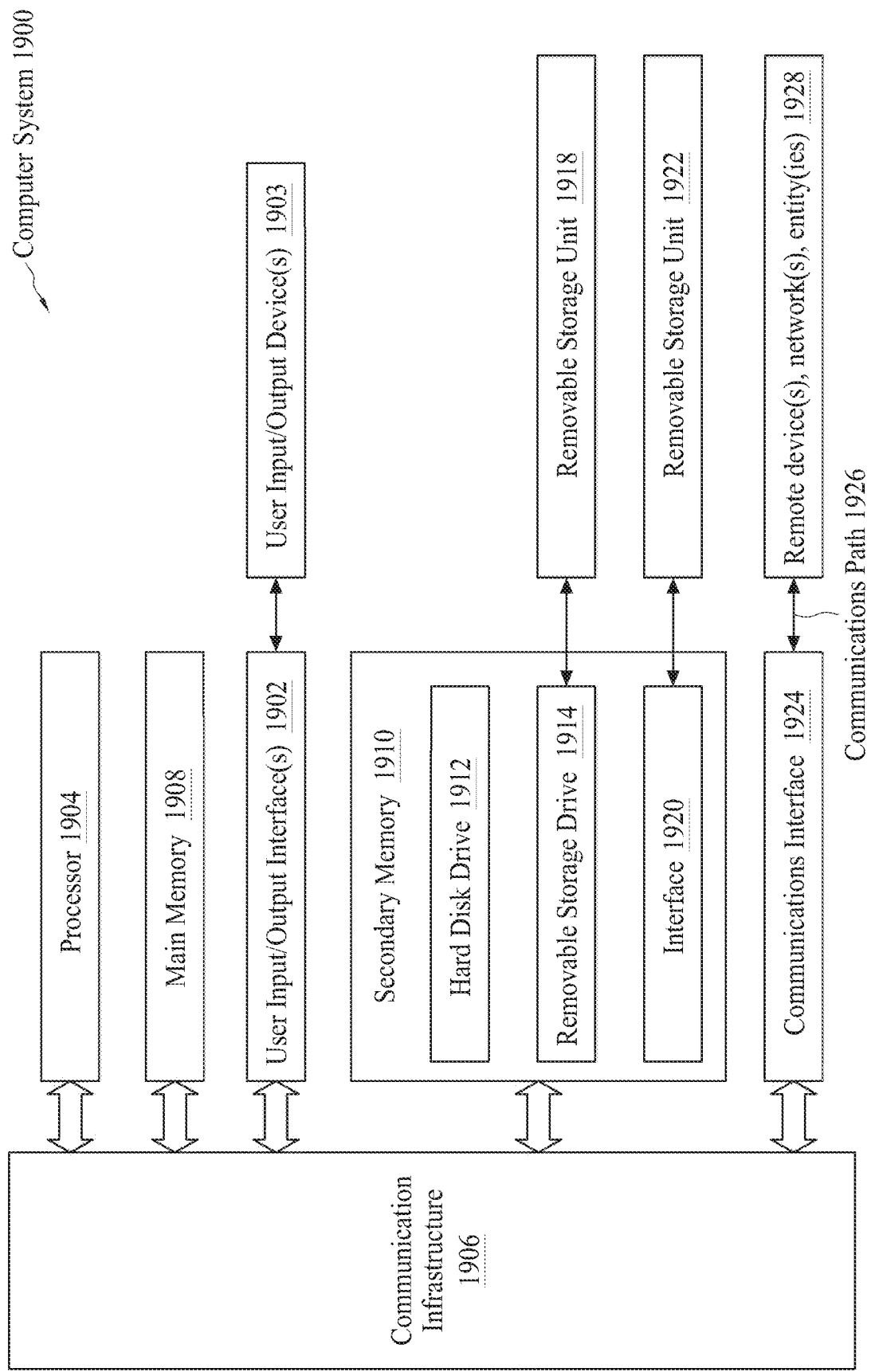
FIG. 19 is an illustration of an example computer system in which various embodiments of the present disclosure can be implemented, according to some embodiments of the present disclosure.

FIG. 19 is an illustration of an example computer system 1900 in which various embodiments of the present disclosure can be implemented, according to some embodiments, Computer system 1900 can be any well-known computer capable of performing the functions and operations described herein. For example, and without limitation, computer system 1900 can be capable of pre-placing layout cells and connecting layout units in the layout cells to provide circuit implementations in an IC layout design using, for example, an FDA tool. Computer system 1900 can be used, for example, to execute one or more operations in method 1400, which describes an example method for connecting layout units in a pre-placement layout cell.

Computer system 1900 includes one or more processors (also called central processing units, or CPUs), such as a processor 1904. Processor 1904 is connected to a communication infrastructure or bus 1906. Computer system 1900 also includes input/output device(s) 1903, such as monitors, keyboards, pointing devices, etc., that communicate with communication infrastructure or bus 1906 through input/output interface(s) 1902. An EDA tool can receive instructions to implement functions and operations described herein—e.g., method 1400 of FIG. 14—via input/output device(s) 1903. Computer system 1900 also includes a main or primary memory 1908, such as random access memory (RAM). Main memory 1908 can include one or more levels of cache. Main memory 1908 has stored therein control logic (e.g., computer software) and/or data. In some embodiments, the control logic (e.g., computer software) and/or data can include one or more of the operations described above with respect to method 1400 of FIG. 14.

Computer system 1900 can also include one or more secondary storage devices or memory 1910. Secondary memory 1910 can include, for example, a hard disk drive 1912 and/or a removable storage device or drive 1914. Removable storage drive 1914 can be a floppy disk drive, a magnetic tape drive, a compact disk drive, an optical storage device, tape backup device, and/or any other storage device/drive.

Removable storage drive 1914 can interact with a removable storage unit 1918. Removable storage unit 1918 includes a computer usable or readable storage device having stored thereon computer software (control logic) and/or data. Removable storage unit 1918 can be a floppy disk, magnetic tape, compact disk, DVD, optical storage disk, and/any other computer data storage device. Removable storage drive 1914 reads from and/or writes to removable storage unit 1918 in a well-known manner.

According to some embodiments, secondary memory 1910 can include other means, instrumentalities or other approaches for allowing computer programs and/or other instructions and/or data to be accessed by computer system 1900. Such means, instrumentalities or other approaches can include, for example, a removable storage unit 1922 and an interface 1920. Examples of the removable storage unit 1922 and the interface 1920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1910, removable storage unit 1918, and/or removable storage unit 1922 can include one or more of the operations described above with respect to method 1400 of FIG. 14.

Computer system 1900 can further include a communication or network interface 1924. Communication interface 1924 enables computer system 1900 to communicate and interact with any combination of remote devices, remote networks, remote entities, etc. (individually and collectively referenced by reference number 1928). For example, communication interface 1924 can allow computer system 1900 to communicate with remote devices 1928 over communications path 1926, which can be wired and/or wireless, and which can include any combination of LANs, WANs, the Internet, etc. Control logic and/or data can be transmitted to and from computer system 1900 via communication path 1926.

The operations in the preceding embodiments can be implemented in a wide variety of configurations and architectures. Therefore, some or all of the operations in the preceding embodiments—e.g., method 1400 of FIG. 14—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 1900, main memory 1908, secondary memory 1910, and removable storage units 1918 and 1922, as well as tangible articles of manufacture embodying any combination of the foregoing. Such control logic, when executed by one or more data processing devices (such as computer system 1900), causes such data processing devices to operate as described herein.

Figure 20:
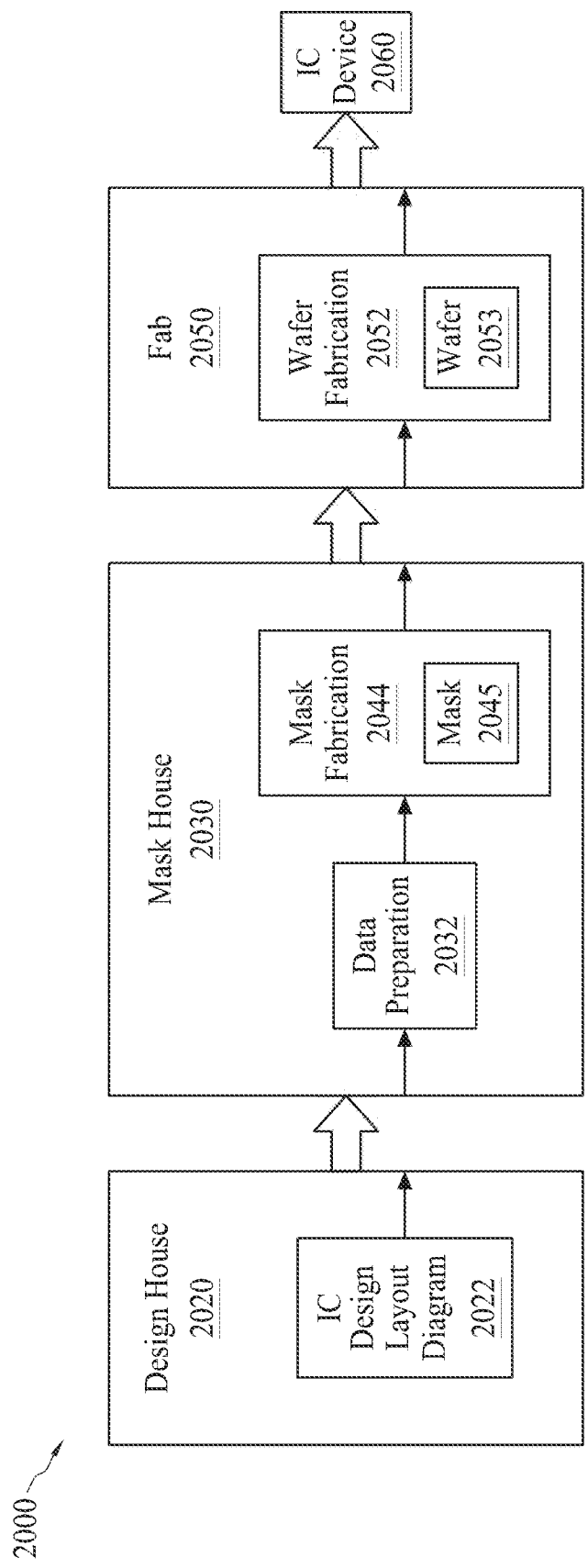
FIG. 20 is an illustration an integrated circuit manufacturing system and associated integrated circuit manufacturing flow, according to some embodiments of the present disclosure.

FIG. 20 is an illustration of an IC manufacturing system 2000 and associated IC manufacturing flow, according to some embodiments. In some embodiments, the layout cells described herein—e.g., layout 100 and layout cell 110 of FIG. 1, layout cell 510 of FIG. 5, layout cell 610 of FIG. 6, layout cell 710 of FIG. 7, layout cell 810 of FIG. 8, layout cell 1010 of FIG. 10, layout cell 1110 of FIG. 11, layout cell 1210 of FIG. 12, layout cell 1310 of FIG. 13, layout 1700 of FIG. 17, and layout 1800 of FIG. 18—can be fabricated using IC manufacturing system 2000.

IC manufacturing system 2000 includes a design house 2020, a mask house 2030, and an IC manufacturer/fabricator ("fab") 2050—each of which interacts with one another in the design, development, and manufacturing cycles and/or services related to manufacturing an IC device 2060. Design house 2020, mask house 2030, and fab 2050 are connected by a communications network. In some embodiments, the communications network is a single network. In some embodiments, the communications network is a variety of different networks, such as an intranet and the Internet. The communications network includes wired and/or wireless communication channels. Each of design house 2020, mask house 2030, and fab 2050 interacts with one another and provides services to and/or receives services from one another. In some embodiments, two or more of design house 2020, mask house 2030, and fab 2050 coexist in a common facility and use common resources.

Design house 2020 generates an IC design layout diagram 2022. IC design layout diagram 2022 includes various geometrical patterns, such as the patterns shown in layout 100 of FIG. 1, layout unit 130 of FIG. 2, layout unit 330 of FIG. 3, layout unit 430 of FIG. 4, layout cell 510 of FIG. 5, layout cell 610 of FIG. 6, layout cell 710 of FIG. 7, layout cell 810 of FIG. 8, layout unit 903 of FIG. 9, layout cell 1010 of FIG. 10, layout cell 1110 of FIG. 11, layout cell 1210 of FIG. 12, layout cell 1310 of FIG. 13, and layout 1700 of FIG. 17. The geometrical patterns correspond to patterns of metal, oxide, or semiconductor layers that make up the various components of IC device 2060 to be fabricated. The various layers combine to form various IC features. For example, a portion of IC design layout diagram 2022 includes various IC features, such as an active region, a gate electrode, a source and drain, and conductive segments or vias of an interlayer interconnection, to be formed in a semiconductor substrate (e.g., a silicon wafer) and various material layers disposed on the semiconductor substrate, Design house 2020 implements a proper design procedure to form IC design layout diagram 2022. The design procedure includes one or more of logic design, physical design, and place and route design. IC design layout diagram 2022 can be presented in one or more data files with information on the geometrical patterns. For example, IC design layout diagram 2022 can be expressed in a GDSII file format or DFII file format.

Mask house 2030 includes data preparation 2032 and mask fabrication 2044. Mask house 2030 uses IC design layout diagram 2022 to manufacture a mask 2045 (or reticle 2045) to be used for fabricating the various layers of IC device 2060. Mask house 2030 performs mask data preparation 2032, where IC design layout diagram 2022 is translated into a representative data file ("RDF"). Mask data preparation 2032 provides the RDF to mask fabrication 2044. Mask fabrication 2044 includes a mask writer that converts the RDF to an image on a substrate, such as mask 2045 or a semiconductor wafer 2053. IC design layout diagram 2022 can be manipulated by mask data preparation 2032 to comply with particular characteristics of the mask writer and/or requirements of fab 2050. In FIG. 20, data preparation 2032 and mask fabrication 2044 are illustrated as separate elements. In some embodiments, data preparation 2032 and mask fabrication 2044 can be collectively referred to as "mask data preparation."

In some embodiments, data preparation 2032 includes optical proximity correction (OPC), which uses lithography enhancement techniques to compensate for image errors, such as those that can arise from diffraction, interference, and other process effects. OPC adjusts IC design layout diagram 2022. In some embodiments, data preparation 2032 includes further resolution enhancement techniques (RET), such as off-axis illumination, sub-resolution assist features, phase-shifting masks, other suitable techniques, and combinations thereof. In some embodiments, inverse lithography technology (ILT) can be used, which treats OPC as an inverse imaging problem.

In some embodiments, data preparation 2032 includes a mask rule checker (MRC) that checks whether IC design layout diagram 2022 has undergone OPC with a set of mask creation rules that include geometric and/or connectivity restrictions to ensure sufficient margins, to account for variability in semiconductor manufacturing processes. In some embodiments, the MRC modifies IC design layout diagram 2022 to compensate for limitations during mask fabrication 2044, which may undo part of the modifications performed by OPC to meet mask creation rules.

In some embodiments, data preparation 2032 includes lithography process checking (LPC) that simulates processing that will be implemented by flub 2050 to fabricate IC device 2060. LPC simulates this processing based on IC design layout diagram 2022 to create a simulated manufactured device, such as IC device 2060. The processing parameters in the LPC simulation can include parameters associated with various processes of the IC manufacturing cycle, parameters associated with tools used for IC manufacturing, and/or other aspects of the manufacturing process. LPC takes into account various factors, such as aerial image contrast, depth of focus (DOF), mask error enhancement factor (MEEF), and other suitable factors. In some embodiments, after a simulated manufactured device has been created by LPC and if the simulated device does not satisfy design rules, OPC and/or MRC are be repeated to further refine IC design layout diagram 2022.

in some embodiments, data preparation 2032 includes additional features, such as a logic operation (LOP) to modify IC design layout diagram 2022 based on manufacturing rules, Additionally, the processes applied to IC design layout diagram 2022 during data preparation 2032 may be executed in a different order than described above.

After data preparation 2032 and during mask fabrication 2044, mask 2045 is fabricated based on the modified IC design layout diagram 2022. In some embodiments, mask fabrication 2044 includes performing one or more lithographic exposures based on IC design layout diagram 2022. In some embodiments, an electron-beam (e-beam) or a mechanism of multiple e-beams are used to form a pattern on mask 2045 based on the modified IC design layout diagram 2022.

Mask 2045 can be formed by various technologies. In some embodiments, mask 2045 is formed using binary technology. In some embodiments, a mask pattern includes opaque regions and transparent regions. A radiation beam, such as an ultraviolet (UV) beam, can be used to expose the image sensitive material layer (e.g., photoresist) coated on a wafer. The radiation beam is blocked by the opaque region and transmits through the transparent regions. For example, a binary mask version of mask 2045 includes a transparent substrate (e.g., fused quartz) and an opaque material (e.g., chromium) coated in the opaque regions of the binary mask.

In some embodiments, mask 2045 is formed using a phase shift technology. In a phase shift mask (PSM) version of mask 2045, various features in the pattern formed on the phase shift mask are configured to have proper phase difference to enhance the resolution and imaging quality. For example, the phase shift mask can be attenuated PSM or alternating PSM.

The mask generated by mask fabrication 2044 is used in a variety of processes. For example, the mask can be used in an ion implantation process to form various doped regions in semiconductor wafer 2053, in an etching process to form various etching regions in semiconductor wafer 2053, and/or in other suitable processes.

Fab 2050 includes wafer fabrication 2052. Fab 2050 can include one or more manufacturing facilities for the fabrication of a variety of different IC products. In some embodiments, fab 2050 is a semiconductor foundry. For example, there may be a manufacturing facility for front-end fabrication of IC products (front-end-of-line (FEOL) fabrication), a second manufacturing facility to provide back end fabrication for the interconnection and packaging of the IC products (back-end-of-line (BEOL) fabrication), and a third manufacturing facility to provide other services for the foundry business.

Fab 2050 uses mask 2045 fabricated by mask house 2030 to fabricate IC device 2060. In some embodiments, semiconductor wafer 2053 is fabricated by fab 2050 using mask 2045 to form IC device 2060. In some embodiments, the IC fabrication includes performing one or more lithographic exposures based on IC design layout diagram 2022. Semiconductor wafer 2053 includes a silicon substrate or other appropriate substrate with material layers formed thereon. Semiconductor wafer 2053 further includes doped regions, dielectric features, multilevel interconnects, and other suitable features.

The disclosed embodiments relate to optimizing layout cells in an IC layout design. As technology increases and the demand for scaled. ICs grow, an increasing number of layout cells are required to fit in smaller IC layout designs, thus creating challenges for IC manufacturers. Embodiments of the present disclosure address this challenge, among others, by introducing layout cells with different configurations to optimize a circuit implementation in the IC layout design while minimizing the insertion of dummy fill structures by an EDA tool.

Embodiments of the present disclosure describe a method for cell placement in an IC layout design. The method includes defining a layout unit for a circuit implementation; arranging multiple layout units into a layout cell; editing the layout cell to connect a first set of the layout units to be representative of the circuit implementation and a second set of the layout units to be representative of a non-functional circuit; and inserting one or more dummy fill structures in areas of the layout cell unoccupied by the first and second sets of layout units. These operations can be performed by one or more processors.

Embodiments of the present disclosure describe a system with a memory and a processor. The memory is configured to store instructions. When executing the instructions, the process is configured to operations that include defining a layout unit for a circuit implementation; arranging multiple layout units into a layout cell; and editing the layout cell to connect a first set of the layout units to be representative of the circuit implementation and to connect a second set of the layout units to be representative of a non-functional circuit.

Embodiments of the present disclosure describe a non-transitory computer-readable medium having instructions stored thereon that, when executed by a computing device, causes the computing device to perform operations. The operations include defining a layout unit for a circuit implementation; arranging multiple layout units into in a layout cell; editing the layout cell to connect a first set of the layout units to be representative of the circuit implementation and to connect a second set of the layout units to be representative of a non-functional circuit; and performing a design rule check operation to confirm that the edited layout cell conforms to predetermined design rules associated with a semiconductor manufacturing process.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   connecting a first set of a plurality of layout units to be representative of a circuit implementation;
   connecting a second set of the plurality of layout units to be representative of a non-functional circuit; and
   after manufacture of the circuit implementation, modifying the circuit implementation using the second set of the plurality of layout units, wherein at least one of the connecting the first set of the plurality of layout units, connecting the second set of the plurality of layout units, and modifying the circuit implementation is performed by one or more processors.

2. The method of claim 1, further comprising:
   inserting one or more dummy fill structures in areas of a layout cell unoccupied by the first and second sets of the plurality of layout units.

3. The method of claim 1, further comprising:
   placing the first and second sets of the plurality of layout units into a layout cell with an electronic design automation tool.

4. The method of claim 3, wherein placing the first and second sets of the plurality of layout units comprises abutting the first and second sets of the plurality of layout units in an arrangement with a hollow area devoid of layout units from the first and second sets of the plurality of layout units.

5. The method of claim 4, further comprising:
   placing another circuit implementation in the hollow area.

6. The method of claim 1, wherein connecting the first set of the plurality of layout units comprises placing one or more interconnections in a layout cell to connect the first set of the plurality of layout units to one another.

7. The method of claim 1, wherein connecting the second set of the plurality of layout units comprises placing one or more interconnections in a layout cell to connect the second set of the plurality of layout units to one another.

8. The method of claim 1, wherein connecting the second set of the plurality of layout units comprises placing one or more interconnections in a layout cell to connect the second set of the plurality of layout units to a power supply, ground, or a combination thereof.

9. A computer system, comprising:
   a memory configured to store instructions; and
   a processor, which when executing the instructions, is configured to perform operations comprising:

connecting a first set of a plurality of layout units to be representative of a circuit;

connecting a second set of the plurality of layout units to be representative of a non-functional circuit; and after manufacture of the circuit, modifying the circuit using the second set of the plurality of layout units.

10. The computer system of claim 9, the operations further comprising:

defining a layout unit for the circuit.

11. The computer system of claim 10, wherein defining the layout unit comprises selecting:

a first layout unit with a first single diffusion layout layer and a first single polysilicon layout layer traversing over the first single diffusion layout layer;

a second layout unit with two diffusion layout layers and a second single polysilicon layout layer traversing over the two diffusion layout layers;

a third layout unit with a second single diffusion layout layer and two polysilicon layout layers traversing over the second single diffusion layout layer; or a combination thereof.

12. The computer system of claim 9, the operations further comprising:

abutting the first and second sets of the plurality of layout units, wherein:

a top side of a first layout unit from the first and second sets of the plurality of layout units abuts a bottom side of a second layout unit from the first and second sets of the plurality of layout units;

a bottom side of the first layout unit abuts a top side of a third layout unit from the first and second sets of the plurality of layout units;

a right side of the first layout unit abuts a left side of a fourth layout unit from the first and second sets of the plurality of layout units; and a left side of the first layout unit abuts a right side of a fifth layout unit from the first and second sets of the plurality of layout units.

13. The computer system of claim 9, the operations further comprising:

mirror abutting the first and second sets of the plurality of layout units, wherein a first group of layout units from the first and second sets of the plurality of layout units has an orientation symmetrical to a second group of layout units from the first and second sets of the plurality of layout units about a vertical axis.

14. The computer system of claim 9, the operations further comprising:

flip abutting the first and second sets of the plurality of layout units, wherein a third group of layout units from the first and second sets of the plurality of layout units has an orientation symmetrical to a fourth group of layout units from the first and second sets of the plurality of layout units about a horizontal axis.

15. The computer system of claim 9, the operations further comprising:

abutting the first and second sets of the plurality of layout units in an arrangement with a hollow area devoid of layout units from the first and second sets of the plurality of layout units.

16. The computer system of claim 9, the operations further comprising:

placing the first and second sets of the plurality of layout units into a layout cell with an electronic design automation tool.

17. A non-transitory computer-readable medium having instructions stored thereon that, when executed by a computing device, cause the computing device to perform operations comprising:

connecting a first set of a plurality of layout units to be representative of a circuit;

connecting a second set of the plurality of layout units to be representative of a non-functional circuit; and after manufacture of the circuit, modifying the circuit using the second set of the plurality of layout units.

18. The non-transitory computer-readable medium of claim 17, the operations further comprising:

inserting one or more dummy fill structures in areas of a layout cell unoccupied by the first and second sets of the plurality of layout units.

19. The non-transitory computer-readable medium of claim 17, the operations further comprising:

placing the first and second sets of the plurality of layout units into a layout cell with an electronic design automation tool.

20. The non-transitory computer-readable medium of claim 19, wherein placing the first and second sets of the plurality of layout units comprises abutting the first and second sets of the plurality of layout units in an arrangement with a hollow area devoid of layout units from the first and second sets of the plurality of layout units.

* * * * *